United States Patent
Baumberg et al.

(10) Patent No.: US 9,561,615 B2
(45) Date of Patent: Feb. 7, 2017

(54) MANUFACTURE OF COMPOSITE OPTICAL MATERIALS

(75) Inventors: Jeremy John Baumberg, Cambridge (GB); David Snoswell, Cambridge (GB); Christopher Finlayson, Cambridge (GB); Qibin Zhao, Cambridge (GB); Gotz Peter Hellmann, Darmstadt (DE); Peter Wolfgang Andreas Spahn, Darmstadt (DE); Christian Gerhard Schafer, Darmstadt (DE)

(73) Assignees: CAMBRIDGE ENTERPRISE LIMITED, Cambridge (GB); FRAUNHOFER-GESELLSCHAFT ZUR FORDERGUNG DER ANGEWANDTEN FORSCHUNG E.V., Munich (DE)

( * ) Notice: Subject to any disclaimer, the term of this patent is extended or adjusted under 35 U.S.C. 154(b) by 514 days.

(21) Appl. No.: 13/979,358

(22) PCT Filed: Jan. 12, 2012

(86) PCT No.: PCT/GB2012/000028
§ 371 (c)(1),
(2), (4) Date: Jul. 11, 2013

(87) PCT Pub. No.: WO2012/095634
PCT Pub. Date: Jul. 19, 2012

(65) Prior Publication Data
US 2013/0288035 A1    Oct. 31, 2013

(30) Foreign Application Priority Data

Jan. 12, 2011 (GB) .................................. 1100506.3
Jan. 13, 2011 (GB) .................................. 1100561.8

(51) Int. Cl.
*C30B 1/00* (2006.01)
*B29C 55/02* (2006.01)
(Continued)

(52) U.S. Cl.
CPC ......... *B29C 55/023* (2013.01); *B29C 47/0014* (2013.01); *B29C 55/00* (2013.01);
(Continued)

(58) Field of Classification Search
CPC ..................................... C30B 1/00; G02F 1/01
See application file for complete search history.

(56) References Cited

U.S. PATENT DOCUMENTS

| | | | |
|---|---|---|---|
| 4,268,413 A | 5/1981 | Dabisch | |
| 4,703,020 A | 10/1987 | Nakano | |

(Continued)

FOREIGN PATENT DOCUMENTS

| | | |
|---|---|---|
| EP | 0168988 | 1/1986 |
| EP | 0955323 | 11/1999 |

(Continued)

OTHER PUBLICATIONS

Arsenault, et al., 2007, Nature Photonics, vol. 1:468-472, "Photoniccrystal full-colour displays".

(Continued)

*Primary Examiner* — Robert M Kunemund
(74) *Attorney, Agent, or Firm* — Swanson & Bratschun, L.L.C.

(57) ABSTRACT

A polymer opal material comprises a three dimensionally periodic arrangement of core particles in a matrix material and exhibits structural color via Bragg reflection. IN a process for manufacturing such a material, a sandwich structure is provided, of a precursor composite material held between first and second sandwiching layers. A relative shear strain of at least 10% is imposed on the precursor (Continued)

composite material by curling the sandwich structure around a roller. The shear strain is cycled, in order to promote the formation of the three dimensional periodic arrangement.

45 Claims, 26 Drawing Sheets

(51) Int. Cl.
B29C 55/00 (2006.01)
B29C 55/18 (2006.01)
B29D 11/00 (2006.01)
B82Y 20/00 (2011.01)
C30B 29/68 (2006.01)
B29C 47/00 (2006.01)

(52) U.S. Cl.
CPC .......... B29C 55/18 (2013.01); B29D 11/0073 (2013.01); B29D 11/00663 (2013.01); B82Y 20/00 (2013.01); C30B 29/68 (2013.01); B29C 47/0002 (2013.01); B29K 2995/0018 (2013.01); Y10T 428/249921 (2015.04)

(56) References Cited

U.S. PATENT DOCUMENTS

| | | | |
|---|---|---|---|
| 5,139,611 A * | 8/1992 | Pusey | C30B 5/00 117/3 |
| 5,160,472 A | 11/1992 | Zachariades | |
| 5,281,370 A | 1/1994 | Asher et al. | |
| 5,612,151 A | 3/1997 | Hughen | |
| 6,165,389 A | 12/2000 | Asher et al. | |
| 6,310,115 B1 | 10/2001 | Vanmaele | |
| 6,337,131 B1 | 1/2002 | Rupaner | |
| 6,847,477 B2 | 1/2005 | Oron et al. | |
| 6,950,584 B1 | 9/2005 | Suzuki | |
| 2002/0074537 A1 | 6/2002 | John et al. | |
| 2002/0154383 A1 | 10/2002 | Oron et al. | |
| 2003/0047711 A1 | 3/2003 | Kawata | |
| 2003/0122112 A1 | 7/2003 | Foulger et al. | |
| 2004/0227455 A1 | 11/2004 | Moon et al. | |
| 2004/0253443 A1 | 12/2004 | Anselmann | |
| 2005/0101698 A1 | 5/2005 | Harada et al. | |
| 2005/0136345 A1 | 6/2005 | Lazarev | |
| 2005/0142343 A1 | 6/2005 | Winkler | |
| 2005/0228072 A1 | 10/2005 | Winkler | |
| 2006/0014099 A1 | 1/2006 | Faler | |
| 2006/0254315 A1 | 11/2006 | Winkler et al. | |
| 2006/0292344 A1 | 12/2006 | Winkler et al. | |
| 2007/0160521 A1 | 7/2007 | Winkler et al. | |
| 2007/0178307 A1 | 8/2007 | Winkler et al. | |
| 2007/0207410 A1 | 9/2007 | Leatherdale | |
| 2008/0030837 A1 | 2/2008 | Ashrit et al. | |
| 2008/0095664 A1 | 4/2008 | Chopra et al. | |
| 2009/0012207 A1 | 1/2009 | Leyrer et al. | |
| 2009/0034051 A1 | 2/2009 | Arsenault et al. | |
| 2010/0001509 A1 | 1/2010 | Whiteman | |
| 2010/0045027 A1 | 2/2010 | Whiteman | |
| 2010/0046572 A1 | 2/2010 | De Rossi et al. | |

FOREIGN PATENT DOCUMENTS

| | | |
|---|---|---|
| EP | 1425322 | 6/2004 |
| EP | 1469020 | 10/2004 |
| EP | 1674596 | 6/2006 |
| EP | 1911814 | 4/2008 |
| EP | 2054242 | 2/2010 |
| EP | 2054241 | 3/2010 |
| EP | 2259100 | 12/2010 |
| EP | 2305762 | 4/2011 |
| GB | 1284711 | 8/1972 |
| GB | 2357515 | 3/2001 |
| GB | 2472987 | 9/2009 |
| GB | 2474951 | 12/2010 |
| JP | 61-014616 | 1/1986 |
| JP | 2006/028202 | 2/2006 |
| JP | 2010/113969 | 5/2010 |
| JP | 2010-117497 | 5/2010 |
| JP | 2010-125652 | 6/2010 |
| WO | WO 00/73795 | 12/2000 |
| WO | WO 01/18283 | 3/2001 |
| WO | WO 01/26611 | 4/2001 |
| WO | WO 02/44301 | 6/2002 |
| WO | WO 02/44728 | 6/2002 |
| WO | WO 03/025035 | 3/2003 |
| WO | WO 03/064062 | 8/2003 |
| WO | WO 03/106557 | 12/2003 |
| WO | WO 2004/034134 | 5/2004 |
| WO | WO 2004/059347 | 7/2004 |
| WO | WO 2004/096894 | 11/2004 |
| WO | WO 2005/028396 | 3/2005 |
| WO | WO 2005/056621 | 6/2005 |
| WO | WO 2005/056622 | 6/2005 |
| WO | WO 2005/080475 | 9/2005 |
| WO | WO 2006/067482 | 6/2006 |
| WO | WO 2006/097173 | 9/2006 |
| WO | WO 2007/016675 | 2/2007 |
| WO | WO 2008/005488 | 1/2008 |
| WO | WO 2008/017864 | 2/2008 |
| WO | WO 2008/017869 | 2/2008 |
| WO | WO 2008/100901 | 8/2008 |
| WO | WO 2008/147431 | 12/2008 |
| WO | WO 2009/042207 | 4/2009 |
| WO | WO 2009/050448 | 4/2009 |
| WO | WO 2009/060166 | 5/2009 |
| WO | WO 2009/061823 | 5/2009 |
| WO | WO 2010/020054 | 2/2010 |
| WO | WO 2010/020928 | 2/2010 |
| WO | WO 2010/039634 | 4/2010 |
| WO | WO 2010/119247 | 10/2010 |
| WO | WO 2010/120361 | 10/2010 |
| WO | WO 2010/136758 | 12/2010 |
| WO | WO 2010/139930 | 12/2010 |
| WO | WO 2011/004190 | 1/2011 |
| WO | WO 2011/023946 | 3/2011 |
| WO | WO 2012/095634 | 7/2012 |
| WO | WO 2012/131295 | 10/2012 |
| WO | WO 2012/172084 | 12/2012 |
| WO | WO 2013/079955 | 6/2013 |

OTHER PUBLICATIONS

Ciba Speciality Chemicals, 2003, Key Products Selection Guide, October G-48/2003, "Photoinitiators for UV Curing".
Cui et al., 2009, J. Mater. Chem., vol. 19:5499-5002, "Fabrication of large-area patterned photonic crystals by ink-jet printing".
Elsner et al., 2009, J. Chem. Phys. vol. 130:154901, "Simple models for two-dimensional tunable colloidal crystals in rotating ac electric fields".
European Search Report on EP 12700722.7 dated Jul. 15, 2014.
Ge et al., 2009, Advanced Materials, vol. 21: 4259-4264, "Rewritable Photonic Paper with Hygroscopic Salt Solution as Ink".
George et al., 2009, Adv. Mater., vol. 21:66-70, "Direct Laser Writing of Photoresponsive Colloids for Microscale Patterning of 3D Porous Structures".
Halevi et al, 1999, Appl. Phys. Lett. vol. 75, Issue18:2725-2727, "Photonic crystals as optical components".
Harun-ur-Rashid et al., 2009, The Chemical Record vol. 9:87, "Structural colored gels for tunable soft photonic crystals".
Ibisate et al., 2008, J. Opt. A: Pure Appl. Opt.,vol. 10:125202, "Vanadium dioxide thermochromic opals grown by chemical vapour deposition".
International search report on PCT/EP2012/061513 dated Feb. 11, 2013.
International search report on PCT/GB2010/001596 dated Dec. 29, 2010.
International search report on PCT/GB2012/000278 dated Jul. 24, 2012.
International search report on PCT/GB2012/052958 dated Jan. 30, 2013.

(56) References Cited

OTHER PUBLICATIONS

International search report on PCT/EP2012/061513 dated Dec. 17, 2013.
International search report on PCT/GB2010/001596 dated Feb. 28, 2012.
International search report on PCT/GB2012/000028 dated Jul. 16, 2013.
International search report on PCT/GB2012/000278 dated Oct. 1, 2013.
Jiang et al., 1999, Chem. Mater 11:2132-2140, "Single-Crystal Colloidal Multilayers of Controlled Thickness".
Kim et al., 2009, Nature Photonics, 2009, vol. 3:534-540, "Structural colour printing using a magnetically tunable and lithographically fixable photonic crystal".
Kubo et al., 2004, J. Am. Chem. Soc., vol. 126:8314-8319, "Tunable Photonic Band Gap Crystals Based on a Liquid Crystal-Infiltrated Inverse Opal Structure".
Leger et al., 2006, Appl. Phys. Lett., vol. 88:111901, "Reversible thermochromic effects in polyphenylene vinylene)—based polymers".
Leunissen et al., 2009, Adv. Mater., 2009, vol. 21:3116-3120, "Directing Colloidal Self-Assembly with Biaxial Electric Fields".
Liu et al., 2007, Appl. Phys. Lett., vol. 90:213508, "Paperlike thermochromic display".
Lumsdon et al., 2005, The ACS Journal of Surfaces and Colloids, 2005, vol. 21: 4874-4880, "Assembly of colloidal particles into microwires using an alternating electric field".
Lumsdon et al., 2003, Applied Physics Letters vol. 82:949.
Park et al., 2006, Journal of Colloid and Interface Science, vol. 298:713-719, "Direct-write fabrication of colloidal photonic crystal micro arrays by ink-jet printing".
Parker et al., 2001, Nature vol. 409:36-37, "Photonic engineering: Aphrodite's Iridescence".
Rahman et al., 2009, Appl. Phys. vol. 94:405-410, "Thermochromic effect in synthetic opal/polyaniline composite structures".
Reese et al., 2000, Journal of Colloid and Interface Science, vol. 232, Issue 1:76-80, "Synthesis of Highly Charged, Monodisperse Polystyrene Colloidal Particles for the Fabrication of Photonic Crystals".
Reza et al, 2010, Photonics and Nanostructures, vol. 9, Issue 1:82-90, "Optical anisotropy of synthetic opals".
Seeboth et al., 2000, Adv. Mat. vol. 12:1424, "Novel Chromogenic Polymer Gel Networks for Hybrid Transparency and Color Control with Temperature".
Seredyuk et al., 2006, Chem. Mater. vol. 18:2513-2519, "Room Temperature Operational Thermochromic Liquid Crystals".
Smith et al., 2001, Ex. In Fluids, vol. 30:1432, "Temperature sensing with thermochromic liquid crystals".
Snoswell et al., 2006, New Journal of Physics vol. 8:267, "Dynamic control of lattice spacing within colloidal crystals".
Snoswell et al., 2007, Adv. Mater., vol. 19:1523-1527, "pH-Responsive Microrods Produced by Electric-Field-Induced Aggregation of Colloidal Particles".
Taylor, Mike A., 2002, Ch. 2:15-40, "Synthesis of Polymer Dispersions, Chapter 2 of Polymer Dispersions and Their Industrial Applications".
UKIPO Search Report dated Oct. 13, 2011 for corresponding application GB 1110018.7.
UKIPO Search Report dated Oct. 14, 2009 for corresponding application GB 0914761.2.
UKIPO Search Report dated Mar. 16, 2012 for corresponding application GB 1120648.9.
UKIPO Search Report dated Aug. 22, 2011 for corresponding application GB 1105663.7.
van Blaaderen et al., 1997, Nature, 1997, vol. 385:321, "Template-directed colloidal crystallization".
Vukusic et al., 2003, Nature vol. 424:852-855, "Photonic structures in biology".
Yoon et al., 2008, Macromolecules, vol. 41:4582, "Thermochromic Block Copolymer Photonic Gel".
Yoshino et al., 1989, Solid State Commun , vol. 69, "Anomalous dependences of luminescence of poly(3-alkylthiophene) on temperature and alkyl chain length".
Arsenault, et al., 2006, Nature Materials 5: 179-184, "From colour fingerprinting to the control of photoluminescence in elastic photonic crystals".
Asher, et al., 1994, J. Am. Chem. Soc. 116: 4997-4998, "Self-Assembly Motif for Creating Submicron Periodic Materials. Polymerized Crystalline Colloidal Arrays".
Chan, et al., 2011, Adv. Mater 23: 4702-4706, "Block Copolymer Photogenic Gel for Mechanochromic Sensing".
Davidson_2001_RAPRA Review Reports, vol. 12, No. 4, RAPRA technology Ltd ISSN: 0889-3144, "Report 136: Radiation Curing".
International Search Report mailed Jul. 25, 2012 for corresponding International application No. PCT/GB2012/000028.
Jethmalani and Ford, 1996, Chem. Mater 8: 2138-2146, "Diffraction of Visible Light by Ordered Monodisperse Silica-Poly(methyl acrylate) Composite Films".
Jiang and McFarland, 2004, JACS Articles 126: 13778-13786, "Large-Scale Fabrication of Wafer-Size Colloidal Crystals, Macroporous Polymers and Nanocomposites by Spin-Coating".
Kalinina and Kumacheva, 1999, Macromoleules 32: 4122-4129, "A "Core-Shell" Approach to Producing 3D Polymer Nanocomposites".
Kontogeorgos et al., 2010, Physical Review Letters 105: 233909, "Introducing Symmetry Breaking in Nanostructures: Anisotropic Stretch-Tuning Photonic Crystals".
Luck et al., 1963, Ber Bunsengesellschaft 63: 75-83, "Uber Bragg-Reflexe mit sichtbarem Licht an monodispersen Kunststofflatices".
McLachlan et al., 2004, Journal of Materials Chemistry 14: 144-150, "Thin film photonic crystals: synthesis and characterization".
Parnell et al., 2011, Soft Matter 11:3721-3725, "Continuously tuneable optical filters from self-assembled block copolymer blends".
Pursiainen et al., 2005, Applied Physics Letter 87: 101902, "Compact strain-sensitive flexible photonic crystals for sensors".
Pursiainen et al., 2007, Optics Express 15: 9553, "Nanoparticle-tuned structural color from polymer opals".
Pursiainen et al., 2008, Advanced Materials 20: 1484-1487, "Shear-Induced Organization in Flexible Polymer Opals".
Romanov et al., 2001 Physical Review E 63: 056603, "Diffraction of light from thin-film polymethylmethacrylate opaline photonic crystals".
Ruhl and Hellmann, 2001, Macromolecular Chemistry and Physics 202: 3502-3505, "Colloidal Crystals in Latex Films: Rubbery Opals".
Ruhl et al., 2003, Polymer 44: 7625-7634, "Artificial opals prepared by melt comporession".
Ruhl et al., 2004, Macromolecular Chemistry and Physics 205: 1385-1393, "Large Area Monodomain Order in Colloidal Crystals".
Schwalm, 2007, Elsevier B.V., ISBN-10: 0-4M-52979-9, "UV Coatings".
Snoswell et al., 2010 Physical Review E 81: 1539-3755, "Shear ordering in polymer photonic crystals".
Spahn, 2008 Dissertation "Hybridopale and polymere Inversopale".
UKIPO Search Report dated May 11, 2011 for corresponding application No. GB1100506.3.
Viel et al., 2007 Chem. Mater. 19: 5673-5679, "Reversible Deformation of Opal Elastomers".
Vlasov et al., 2000 Physical Review E 61(5): 5784, "Manifestation of intrinsic defects in optical properties of self-organized opal photonic crystals".
Wohlleben et al., 2007 Langmuir 23: 2961-2969, "Mechano-Optical Octave-Tunable Elastic Colloidal Crystals Made from Core-Shell Pollymer Beads with Self-Assembly Techniques".
Ying and Fougler, 2009, Sensors and Actuators B 137: 574-577, "Color characteristics of mechanochromic photonic bandgap composites".

* cited by examiner

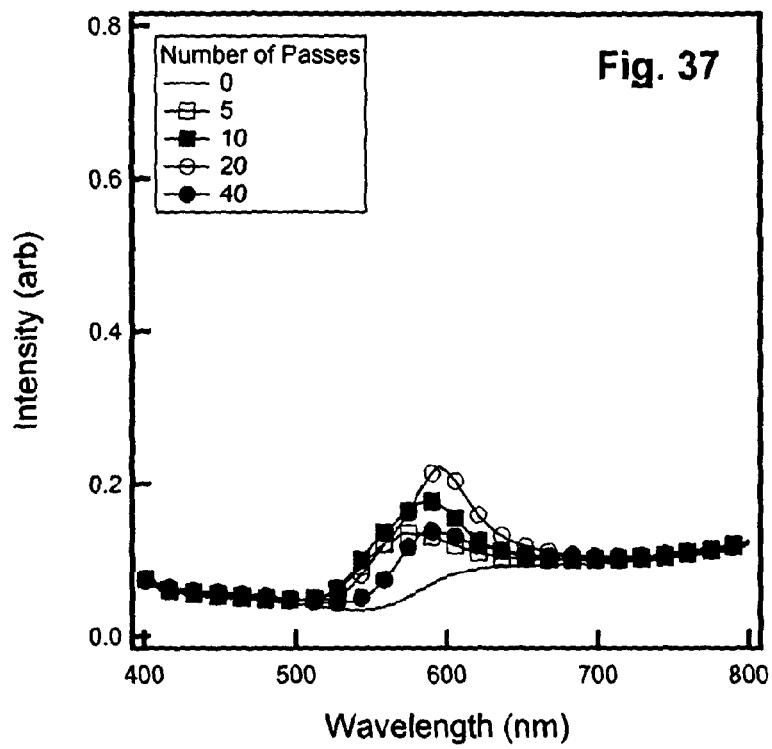
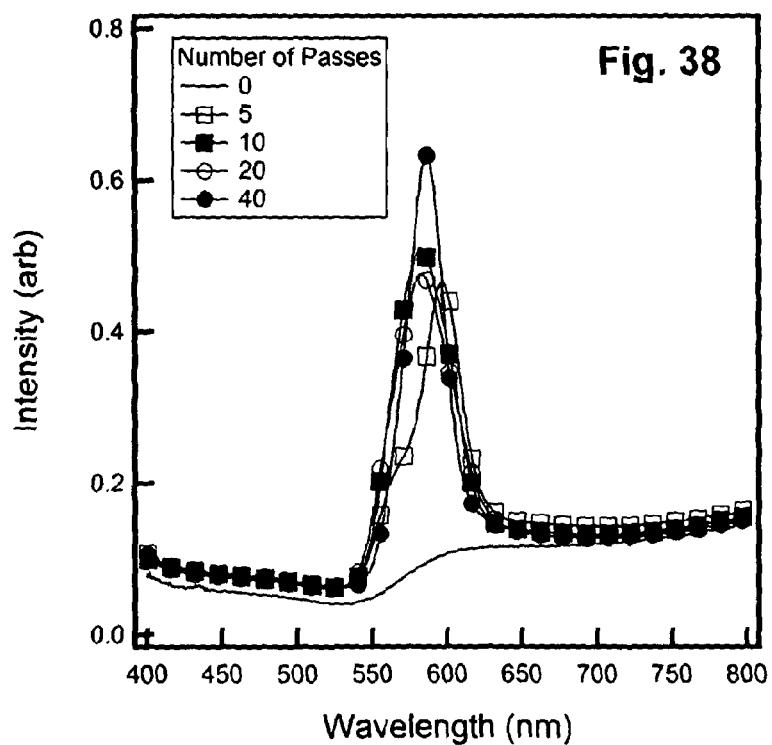

MANUFACTURE OF COMPOSITE OPTICAL MATERIALS

RELATED APPLICATIONS

This application is a 35 U.S.C. §371 national phase application of PCT/GB2012/000028 (WO 2012/095634) filed on Jan. 12, 2012, entitled "Manufacture of Composite Optical Materials", which application claims the benefit of GB Application Serial No. 1100506.3, filed Jan. 12, 2011, and GB Application No. 1100561.8, filed Jan. 13, 2011, which are each incorporated herein by reference in their entirety.

BACKGROUND TO THE INVENTION

Field of the Invention

The present invention relates to methods for the manufacture of composite optical materials and to composite materials obtainable by such methods. The invention has particular, but not exclusive, applicability to materials which display structural colour characteristics.

Related Art

Natural opal is built up from domains consisting of monodisperse silica spheres of diameter 150-400 nm. These spheres are close-packed and therefore form a regular three dimensional lattice structure within each domain. The colour play of such opals is created by Bragg-like scattering of the incident light at the lattice planes of the domains.

It is known to produce synthetic opal-like materials. For example, U.S. Pat. No. 4,703,020 discloses the formation of such materials by allowing silica spheres to sediment from an aqueous dispersion. This sediment is then dried and calcined at 800° C. Subsequently, a solution of zirconium alkoxide is allowed to penetrate into the interstices in the sediment and zirconium oxide is precipitated in the interstices by hydrolysis. The material is then calcined again to leave a structure in which silica spheres are arranged in a three dimensional lattice with zirconium oxide in the interstices. Forming opal-like materials in this way is exceptionally time-consuming and expensive. It is not an industrially-applicable route for the manufacture of significant quantities of materials.

US 2004/0253443 (equivalent to WO03025035) discloses moulded bodies formed from core-shell particles. Each particle is formed of a solid core, and the solid cores have a monodisperse particle size distribution. Each particle has a shell formed surrounding the core. The core and shell have different refractive indices. In one embodiment in this document, the core is formed of crosslinked polystyrene and the shell is formed of a polyacrylate such as polymethyl methacrylate (PMMA). In this case, the core has a relatively high refractive index and the shell has a relatively low refractive index. A polymer interlayer may be provided between the core and shell, in order to adhere the shell to the core. Granules of the core-shell particles are heated and pressed to give a film. In this heating and pressing step shell material is soft but the core material remains solid. The cores form a three dimensional periodic lattice arrangement, and the shell material becomes a matrix material. The resultant material demonstrates an optical opalescent effect. Inorganic nanoparticles (e.g. metal nanoparticles or semiconductor nanoparticles) can be incorporated in the interstices between cores to provide enhanced functionality to the material. US 2004/0253443 suggests mechanisms to explain the ordering of the core particles in the matrix, but these are not fully explained.

US 2005/0142343 (equivalent to WO03064062) provides similar disclosure to US 2004/0253443. However, additionally, a contrast material such as a pigment is stored in the matrix, in order to enhance the optical effect.

US 2005/0228072 (equivalent to WO03106557) provides similar disclosure to US 2004/0253443. However, additionally, a further material is added in order to control the mechanical properties of the composite material. The further material is, for example, a thermoplastic rubber polymer.

WO2004096894 provides similar disclosure to US 2004/0253443, and additionally proposes extruding the composite material as a sheet and subsequently rolling the material. The result is reported to be a uniform colour effect depending on the viewing angle.

Pursiainen et al [O. Pursiainen, J. Baumberg, H. Winkler, B. Viel, P. Spahn and T. Ruhl "Nanoparticle-tuned structural color from polymer opals" Optics Express, 23 Jul. 2007, Vol. 15, No. 15, 9553] discuss the effect of the incorporation of nanoparticles on the optical properties of flexible polymer opals formed using core-shell polymeric particles. The core of the core-shell particles is formed from polystyrene and the outer shell is formed from polyethylacrylate. Ordering of the particles is achieved by causing flow of the particles between two outer covering layers under compression.

SUMMARY OF THE INVENTION

The present inventors consider that the existing methods for manufacturing the composite optical materials discussed above have some disadvantages. For example, relying on uniaxial pressing does not necessarily achieve a high degree of ordering of the core particles, although some ordering is achieved. Similar comments apply to pressing by rolling. Since the achievement of the interesting optical effects discussed above relies on the degree of ordering in the material, it is of great interest to develop improved processes for producing useful degrees of ordering in an industrially applicable way.

One option to assist in the manufacture of the composite materials is as follows. This process, to the knowledge of the inventors, is not published prior art. This approach holds the composite material (the core-shell particles, after extrusion and rolling) between two sandwiching layers to form a sandwich structure. The structure is then subjected to progressive mechanical deformation and heating. This is done by holding the structure (by gripping the sandwich structure using tensioning rollers in a continuous process) and applying a part of the structure to a heated sharp edge. The effect of this is that the part of the structure in contact with the heated sharp edge is bent to a sharp radius of curvature and heated. Then the structure is drawn over the heated sharp edge in order to heat and deform the structure progressively along the length of the structure. Thus, in practice, the structure is pressed and slid over the heated edge. It is considered that this leads to a useful degree of ordering of the core particles in the composite material. However, the process is difficult to carry out, requires significant (and sometimes deleterious) heating of the composite material and still does not necessarily achieve consistent ordering of the particles. Furthermore, the sliding of the structure over the heated edge can lead to scratching of the sandwiching layers. For convenience, we refer to this process as the "hot edge" process.

The present invention has been devised in order to address one or more of the above problems. Preferably, the present invention reduces, avoids, ameliorates or even overcomes one or more of the above problems.

In a first preferred aspect, the present invention provides a process for manufacturing a composite optical material comprising a three dimensionally periodic arrangement of core particles in a matrix material, including the steps:
- (a) providing a sandwich structure of a precursor composite material held between first and second sandwiching layers, wherein the precursor composite material comprises a dispersion of core particles in matrix material;
- (b) for at least part of the sandwich structure, imposing a relative shear displacement between the first and second sandwiching layers, thereby providing a shear strain of at least 10% in the precursor composite material;
- (c) after step (b), reducing the relative shear displacement between the first and second sandwiching layers in order to reduce the shear strain in the precursor composite material, wherein the process includes repeating step (b) after step (c) at least once, the repeating shear strain promoting ordering of the core particles to convert the precursor composite material to the composite optical material.

In a second preferred aspect, the present invention provides a composite optical material obtained by, or obtainable by, a process according to the first aspect.

In a third preferred aspect, the present invention provides an apparatus for carrying out the process of the first aspect on a sandwich structure of a precursor composite material held between first and second sandwiching layers, the apparatus including at least one roller adapted to impose a relative shear displacement between the first and second sandwiching layers, the apparatus thereby adapted to provide a shear strain of at least 10% in the precursor composite material.

In a fourth preferred aspect, the present invention provides an apparatus for carrying out the process of the first aspect on a sandwich structure of a precursor composite material held between first and second sandwiching layers, the apparatus including at least one shear support device adapted to impose a relative shear displacement between the first and second sandwiching layers, the shear support device providing a curved surface for support of the sandwich structure during the process, the curved surface having a substantially uniform radius of curvature of 1 mm or greater, the apparatus thereby adapted to provide a shear strain of at least 10% in the precursor composite material.

Preferred and/or optional features of the invention will now be set out. These are applicable singly or in any combination with any aspect of the invention.

Preferably, the three dimensionally periodic arrangement of core particles in the matrix material of the composite optical material is such as to provide structural colour, when illuminated with white light. The core particles preferably have a different refractive index to the matrix material, at least at room temperature. Preferably this difference in refractive index is at least 0.001, more preferably at least 0.01, still more preferably at least 0.1.

Preferably, in order to form the precursor composite material, there is provided a population of core-shell particles. Each particle preferably comprises a core and a shell material surrounding the core. The population may take the form of granules. Preferably, the population is heated to a temperature at which the shell material is flexible and soft. The population is then preferably subjected to the action of a mechanical force to initiate the formation of a continuous, non-porous body. In some instances (e.g. during injection moulding) this process may also initiate three dimensionally periodic arrangement of the core particles in a matrix of the shell material. This mechanical force is preferably provided by an extrusion process. The result of the extrusion process is typically a ribbon of precursor composite material. Preferably, this ribbon of precursor composite material is captured and held between the first and second sandwiching layers. The resulting structure may then be rolled (or calendered or otherwise pressed) in order to cause the precursor composite material to flow further. Preferably, the composite material is then allowed to cool to a temperature at which the shell material is no longer soft. The resulting sandwich structure can then be subjected to the process of the first aspect in order to provide the required degree of periodicity of the core particles in the matrix.

Other processes can be used in place of extrusion. For example, the action of mechanical force may take place via one or more of: uniaxial pressing (e.g. forming a film or plate); injection-moulding; transfer moulding; co-extrusion; calendering; lamination; blowing; fibre-drawing; embossing; and nano-imprinting.

When the action of force takes place through uniaxial pressing, the precursor composite material is preferably in the form of a film or layer. Suitable films or layers can preferably also be produced by calendering, film blowing or flat-film extrusion.

When the precursor composite material is produced by injection moulding, it is particularly preferred for the demoulding not to take place until after the mould with moulding inside has cooled. When carried out in industry, it is advantageous to employ moulds having a large cooling-channel cross section since the cooling can then take place in a relatively short time. The mould may advantageously be heated before the injection operation.

Preferably, the core particles have a substantially monodisperse size distribution. The size of the core particles depends on the intended wavelength(s) at which the composite optical material should provide the required optical effect(s). For example, it may be desirable for the core particles to have a mean particle diameter in the range from about 5 nm to about 2000 nm. More preferably, the core particles have a mean particle diameter in the region of about 50-500 nm, more preferably 100-500 nm. Still more preferably, the core particles have a mean particle diameter of at least 150 nm. The core particles may have a mean particle diameter of at most 400 nm, or at most 300 nm, or at most 250 nm.

Preferably, the material of the core particles remains substantially rigid and substantially undeformed during the process. This can be achieved by: using a high crosslinking density in the core particles; and/or by using processing temperatures below the glass transition temperature (Tg) of the core material.

Thus, it is possible to use materials with a relatively low Tg for the core particles, provided that their degree of crosslinking is sufficient to avoid deformation of the core particles at the processing temperature using the method of the invention. A suitable degree of crosslinking may be, for example, 1% crosslinking density or higher. More preferably, the degree of crosslinking is 2% crosslinking density or more, more preferably about 10% crosslinking density.

In some alternative embodiments, the core particles may be allowed to deform slightly during the processing, e.g. to form oblate shapes (deformed from spherical), using core particles with crosslinking density below 1%. This can be achieved, for example, using polystyrene (PS) core particles with a suitable degree of crosslinking.

Alternatively, although this is not necessarily preferred, inorganic core materials may be used.

Preferably, the shell of the core-shell particles is bonded to the core via an interlayer.

Preferably, the temperature of the precursor composite material during step (b) is above Tg of the matrix (shell) material. This allows the core particles to "flow" and become ordered. The temperature of the precursor composite material during step (b) is preferably below the melting or decomposition temperature of the matrix (shell) material. Preferred materials for the shell material may not have a melting temperature. It is of course strongly preferred that the temperature during step (b) is below the decomposition temperature of the material of the core particles, the material of the matrix (shell) and the material of the sandwiching layers. It is preferred not to use a particularly high temperature at this stage of the process, unlike known processes for increasing the periodicity of similar optical materials. For industrial-scale processes, high temperatures are not preferred for reasons of efficiency of manufacture. Therefore, in some preferred embodiments, the temperature of the precursor composite material during step (b) may be room temperature. However, in some other embodiments, it may be preferred to heat the structure gently during the process. For example, in some embodiments, such heating may be used in order to provide easier "flow" of the core particles in the matrix and thus faster ordering of the particles. However, a limit on this is where the viscosity of the matrix material is so low that thermal motion and/or diffusion of the core particles disrupts the periodicity of the particles.

Although the processing temperatures that are most suitable will depend strongly on the materials used for the core particles, the shell material and the sandwiching layers, in general the processing temperature in step (b) is at least 10° C. More preferably, the processing temperature in step (b) is at least 20° C. or more preferably at least 50° C. Preferably the processing temperature in step (b) is at most 300° C. More preferably, the processing temperature in step (b) is at most 200° C. Still more preferably, the processing temperature in step (b) is below 200° C. For example, a processing temperature of 190° C. or lower may be used. Different temperature ranges may be preferred when a viscosity-reducing agent is added, as explained in more detail below.

The material used for the first sandwiching layer may be the same as for the second sandwiching layer, although this is not essential. In some embodiments, the finished product may be retained between the sandwiching layers. However, in other embodiments, one or both of the sandwiching layers may be removed or replaced. Preferably, at the processing temperature used in the method of the invention, the material of the sandwiching layers used in the process has a significantly higher (e.g. by a factor of at least 5) elastic modulus (e.g. Young's modulus) than the precursor composite material. However, of course, the sandwiching layers must be bendable to the required radius of curvature without breakage. Additionally, preferably the material of the sandwiching layers used in the process has a significantly higher yield strength (e.g. by a factor of at least 2, more preferably by a factor of at least 5) than the precursor composite material, at the processing temperature. In this way, preferably the processing of the structure in step (b) does not lead to permanent deformation of the sandwiching layers. Furthermore, preferably an elasticity parameter of the sandwiching layers defined as the product of the thickness $t_s$ of the sandwiching layer with the Young's modulus $E_s$ (i.e. the elasticity parameter $t_s E_s$) is significantly higher than the corresponding elasticity parameter for the precursor composite material $t_c E_c$, where $t_c$ is the thickness of the precursor composite material and $E_c$ is the Young's modulus of the precursor composite film. Preferably $t_s E_s$ is at least a factor of 5 greater than $t_c E_c$. The effect of these factors is that the stress required to curl the sandwich structure is preferably not taken up to a significant extent by tensile or compressive strain in the sandwiching layers (i.e. by elongation or contraction of the sandwiching layers themselves) but instead is transmitted to the composite material between the sandwiching layers, to be taken up there as shear strain.

In the context of this disclosure, the term "shear strain", when applied to the precursor composite material, is the modulus of the engineering shear strain. This is calculated as $d/t_c$, where d is the modulus of the relative shear displacement between the first and second sandwiching layers and $t_c$ is the thickness of the precursor composite material before the shear displacement is applied to the first and second sandwiching layers. The modulus of the shear displacement is used here in order that it is clear that in step (b) it is possible for the shear strain to be applied to the composite material either by deforming the sandwich structure so that the first sandwiching layer has a smaller radius of curvature than the second sandwiching layer or vice versa.

The sandwich structure is preferably a lamellar structure in the sense that the length of the structure (e.g. in the direction of processing of the structure) and the width of the structure (e.g. in a direction perpendicular to the length direction but parallel to the surface against which the structure is deformed during step (b)) are significantly greater than the overall thickness of the sandwich structure. The length of the structure may be at least one meter, more preferably many meters. The width of the structure may be at least 5 mm, more preferably at least 1 cm, more preferably still at least 5 cm. The overall thickness of the structure may be 1 mm or less. Further preferred features related to the overall thickness of the structure are set out below. The process of the invention preferably allows the shear strain to be applied substantially across the full width of the sandwich structure, using a shear support device (e.g. roller or other curved support) of suitable lateral width and uniformity.

One advantage of the present invention is that relying on a consideration of the shear strain in the precursor composite material means that it is possible to carry out the process in a reproducible manner, in order to produce composite optical materials having reproducible optical properties. This is an important factor in the industrial application of polymer opal technology.

Preferably, in step (b), the shear strain provided to the precursor composite material is at least 15%. More preferably, the shear strain provided in step (b) is at least 20%, more preferably at least 25%, more preferably at least 30%, more preferably at least 35%, more preferably at least 40%, more preferably at least 45%, more preferably at least 50%. This lower limit for the shear strain is preferably selected based on the materials used for the core-shell particles, since some material combinations provide suitable periodicity even at relatively low shear strains.

Preferably, in step (b), the shear strain provided to the precursor composite material is at most 500%. More preferably, the shear strain provided in step (b) is at most 400%, more preferably at most 300%, more preferably at most 250%. Again, the upper limit for the shear strain is preferably selected based on the materials used for the core-shell particles. Furthermore, it may also be selected based on the number of cycles used (more detail below), since a higher level of shear strain may mean that suitable periodicity can be attained with relatively few repeats of step (b).

For example, it has been found that shear strains of about 150% for step (b) are suitable for some materials combinations.

Preferably, in the process, steps (b) and (c) are repeated more than once. Each performance of steps (b) and (c) is referred to herein as a shear strain cycle. It is possible in one or more of the repetitions of step (b) for the sandwich structure to be curled in the opposite sense to the first occurrence of step (b). However, this is not essential, although it may be preferred. Microscopically, the changes in the shear strain applied to the composite material are so that the core particles can be are forced to oscillate under shear towards the preferred periodic configuration. Preferably, the process uses at least 2 shear strain cycles. More preferably, the process uses at least 3 shear strain cycles, or at least 4 shear strain cycles, or at least 5 shear strain cycles, or at least 6 shear strain cycles, or at least 7 shear strain cycles, or at least 8 shear strain cycles, or at least 9 shear strain cycles, or at least 10 shear strain cycles. However, it is found that the benefit of using multiple shear strain cycles reduces as the number of shear strain cycles increases. Therefore it is preferred, for the sake of efficiency of manufacture, that the number of shear strain cycles is at most 1000. More preferably, the number of shear strain cycles is at most 500 or at most 200, or at most 100 or at most 80.

Preferably, the radius of curvature applied to the structure in step (b) is at least 1 mm. In other words, preferably no part of the structure is curled to a radius of curvature smaller than 1 mm. It is considered by the inventors and by those of skill in this area of technology that a sharp edge requires a radius of curvature of significantly less than 1 mm. The lower limit of the radius of curvature applied to the structure as defined above allows the required shear strain to be applied so that the effect of any stretching of the sandwiching layers on relieving the shear stress in the precursor composite layer is reduced. More preferably, the radius of curvature applied to the structure in step (b) is at least 2 mm. More preferably, the radius of curvature applied to the structure in step (b) is at least 3 mm. More preferably, the radius of curvature applied to the structure in step (b) is at least 4 mm. More preferably, the radius of curvature applied to the structure in step (b) is at least 5 mm. It is considered that, as the radius of curvature increases, the relief effect described above (in relation to stretching of the sandwiching layers) increases. Thus, it is preferred that the radius of curvature applied to the structure in step (b) is at most 10 mm. It is considered that a strain in the sandwiching layers of about 1%, combined with a radius of curvature of the structure of about 10 mm, would significantly reduce the shear strain in the precursor composite material, thereby reducing the progression of the ordering of the core particles.

It should be noted, however, that some embodiments of the invention may operate with a radius of curvature outside the ranges identified above. In some embodiments, parts of the structure may be curled to a radius of at least 10 μm in step (b), for example where the thickness of the sandwiching layers is very small. However, this is not preferred in many embodiments. In other embodiments, the radius of curvature applied to the structure in step (b) may be at most 100 mm, allowing for the use of very stiff materials for the outer layers, such as glass of suitable thickness.

The roller (or, more generally the curved surface of the curved support device) preferably has a radius of curvature corresponding substantially to the radius of curvature applied to the structure during step (b), as set out above.

In the case of a batch-wise process, it is possible for a composite optical material of length L to be manufactured. In that case, it is possible for the entire length of the structure to be subjected to step (b) at the same time. Conveniently, this can be done by winding the structure around a roller or other curved support device.

It is intended that in some embodiments, the curved support device may not be a roller. However, additionally, the curved support device preferably does not comprise a sharp edge for contact with the sandwich structure. In some embodiments, the curved support device may be non-rotatable. In that case, the sandwich structure preferably slides around the curved surface. In order to reduce friction, it is preferred in this case to provide a low friction surface (e.g. a PTFE coating) at the curved surface. This is considered to be a significant departure from previous approaches which employ sharp edge techniques, where friction is considered to be beneficial and where steps are taken in some cases to increase friction.

In the case where the curved support device is a roller, is preferred that the roller rotates with the passage of the structure around it, such that there is substantially no slippage between the roller and the sandwiching layer in contact with the roller. This reduces the frictional drag on the structure. In some cases, the roller may therefore be a passive roller, rotating due to the drawing of the sandwich structure around it. However, in some embodiments, the roller may be powered. Preferably, powering of the roller is to the extent that the roller is rotated to match the speed of the sandwich structure. This has the advantage of avoiding any drag on the contacting sandwiching layer.

In the case of a continuous (or semi-continuous) process, it may not be possible for the entire length of the structure to the subjected to step (b) at the same time. It is possible instead to subject a part (or parts) of the structure to step (b) and at the same time subjecting a part (e.g. an adjacent part) to step (c). In this way, the processing of the structure can be continuous. Subsequent repetitions of steps (b) and/or (c) can be carried out downstream of the initial performance of steps (b) and (c). Conveniently, even in the continuous process, the required shear strain can be applied by winding the structure around a roller. In order to accommodate uptake onto the roller and offtake from the roller, either the structure should pass around the roller a maximum of 1 revolution (and in some embodiments a maximum of 0.5 revolutions, or possibly slightly more than 0.5 revolutions), or (to accommodate multiple revolutions around the roller), the structure should follow a helical path around the roller.

It is particularly preferred that the process is carried out in a manner that allows the sandwiching layers to move (in a shear displacement direction) relative to each other, this shear displacement being resisted substantially only by the precursor composite material. Thus, preferably the sandwiching layers are not clamped together or otherwise fixed together, other than via the precursor composite layer.

In the case where not all of the structure is subjected to step (b) at the same time, preferably a length of at least 0.5 cm of the structure is subjected to a substantially uniform shear strain. This can be provided, for example, by forming this length of structure into a shape having a substantially constant radius of curvature over the same length. More preferably, this length is at least 1 cm, at least 2 cm, at least 4 cm or at least 10 cm long. This allows the precursor composite material to be subjected to a uniform and reproducible process, allowing for more predictable and uniform ordering of the core particles in the matrix.

It is possible to consider the contact angle in step (b), between the sandwich structure and the curved surface for support of the sandwich structure. As discussed above, preferably the curved surface has a constant radius of curvature. Thus, preferably the contact angle θ is the angle subtended at the centre of the radius of curvature by the contact region between the sandwich structure and the curved surface for support of the sandwich structure. Contact angle θ is preferably at least 20°. More preferably, contact angle θ is at least 30°, at least 40°, or at least 50°. In some embodiments it may be preferred for contact angle θ to be less than 60°. However, in other embodiments this is not preferred. Thus, in those other embodiments, preferably contact angle θ is at least 60°, more preferably at least 70°, more preferably at least 80°, or more preferably at least 90°.

In some embodiments, contact angle θ is more than 180°. However, again, in some embodiments, this is not preferred (especially where the radius of curvature is small). Thus, contact angle θ may be at most 180° in some embodiments.

As mentioned above, it is possible for the structure to take a whole revolution around the curved support device (e.g. roller), or more than one revolution.

The required number of shear cycles can be accommodated by passing the structure around a corresponding number of roller combinations.

It is considered that the ordering of the core particles in the precursor composite material begins preferentially at the interfaces between the precursor composite material and the sandwiching layers. During the process, it is considered that the ordering then extends inwards into the precursor composite material. Therefore, at large thickness values, the ordering of the material at the centre of the structure may not be achievable. However, for such large thickness values, this may not be a problem because there will be very many ordered layers nearer the interfaces with the sandwiching layers. Preferably, the thickness of the composite optical material is at most 1 mm. More preferably, the thickness of the composite optical material is at most 0.5 mm, or at most 0.4 mm, or at most 0.3 mm. The thickness of the composite optical material is preferably at least 10 μm, since thinner structures may not have sufficient mechanical integrity for practical uses and may not provide sufficiently strong reflections in order to give a significant colour effect. More preferably, the thickness of the composite optical material is at least 20 μm, or at least 30 μm, or at least 40 μm, or at least 50 μm, or at least 60 μm, or at least 70 μm, or at least 80 μm. A thickness of about 100 μm has been found to be suitable, for example.

The thickness of the sandwiching layers is not particularly limited, unless it is expected that one or more of the sandwiching layers should remain in the finished product (in which case the optical clarity of the sandwiching layer(s) may be important). Preferably, the thickness of the sandwiching layers is at least 20 μm. Preferably, the thickness of the sandwiching layers is at most 200 μm thick. Preferably, the material of the sandwiching layers is mechanically stable up to a temperature of at least 150° C. Preferably the material of the sandwiching layers has a gloss surface. In processes in which the sandwich structure is passed around one or more rollers, it is preferred to avoid sliding of the sandwich structure with respect to the rollers. This can avoid the occurrence of scratches at the outer surface of the sandwiching layers. Such scratching is difficult to avoid in a hot edge type process.

The sandwiching layers can be formed of the same or different materials. Suitable materials include PET, PC, Kapton, for example.

The composite optical material and/or the precursor composite material may comprise auxiliaries and/or additives. These can serve in order to provide desired properties of the body. Examples of auxiliaries and/or additives of this type are antioxidants, UV stabilisers, biocides, plasticisers, film-formation auxiliaries, flow-control agents, fillers, melting assistants, adhesives, release agents, application auxiliaries, demoulding auxiliaries and viscosity modifiers, for example thickeners. Further additives are set out in more detail below, in particular for reducing the viscosity.

Preferably, one or more species of nanoparticles is included in the matrix material, in addition to the cores of the core-shell particles. These particles are selected with respect to their particle size in such a way that they fit into the cavities of the packing (e.g. sphere packing) of the core particles and thus cause only little change in the arrangement of the core particles. Through specific selection of corresponding materials and/or the particle size, it is firstly possible to modify the optical effects of the composite optical material, for example to increase its intensity. Secondly, it is possible through incorporation of suitable "quantum dots", to functionalise the matrix. Preferred materials are inorganic nanoparticles, in particular carbon nanoparticles (e.g. carbon nanotubes), nanoparticles of metals or of II-VI or III-V semiconductors or of materials which influence the magnetic/electrical (electronic) properties of the materials. Examples of further preferred nanoparticles are noble metals, such as silver, gold and platinum, semiconductors or insulators, such as zinc chalcogenides and cadmium chalcogenides, oxides, such as haematite, magnetite or perovskite, or metal pnictides, for example gallium nitride, or mixed phases of these materials. Furthermore, the matrix material can include one or more dyes. A suitable dye may be fluorescent.

Preferably, the nanoparticles have an average particle size of 50 nm or less. The nanoparticles may have an average particle size of at least 5 nm. An average particle size in the range 10-50 nm (e.g. about 20 nm) has been found to give suitable results. Preferably, the proportion by weight of the nanoparticles in the composite is less than 1%, more preferably less than 0.5%, and still more preferably less than 0.1%. The nanoparticles preferably are distributed uniformly in the matrix material.

Preferably, the interlayer is a layer of crosslinked or at least partially crosslinked polymers. The crosslinking of the interlayer here can take place via free radicals, for example induced by UV irradiation, or preferably via di- or polyfunctional monomers. Preferred interlayers in this embodiment are obtainable from a polymerisable or crosslinkable composition comprising 0.01 to 100% by weight, particularly preferably from 0.25 to 10% by weight, of di- or polyfunctional monomers. The composition may also include other monomers, such as monofunctional monomer, as the balance. Preferred di- or polyfunctional monomers are, in particular, isoprene and allyl methacrylate (ALMA). Preferred monofunctional monomers are, in particular, methyl methacrylate and ethylacrylate. Such an interlayer of crosslinked or at least partially crosslinked polymers preferably has a thickness in the range from 10 to 20 nm. Thicker interlayer materials may be possible. Alternatively the di- or polyfunctional monomer can be added during the core polymerisation. In that case the core provides the functionality of the interlayer, meaning that no separate interlayer is necessary. However, in that case, the required quantity of the di- or polyfunctional monomer increases accordingly.

Preferably the shell is formed of a thermoplastic polymer. Since the shell essentially determines the material properties and processing conditions of the core-shell particles, the person skilled in the art will select the shell material in accordance with the usual considerations in polymer technology, but with particular attention to the requirement that there should be a significant refractive index difference compared with the core material, in order to provide spectral colour.

The core particles are preferably spherical, or substantially spherical, in shape. Preferably, the distribution of the diameter of the core particles is substantially monodisperse, e.g. with a standard deviation of 20% or less, more preferably 10% or less, still more preferably 5% or less.

Preferably the core particles are disposed in the composite material in a close packed three dimensional lattice. Specifically, preferably the core particles are disposed in the composite material in a face centred cubic lattice. Preferably, the (111) plane of the lattice is aligned substantially parallel to the inward facing surface of the sandwiching layers.

It can be advantageous for the core:shell weight ratio to be in the range from 2:1 to 1:5, preferably in the range from 3:2 to 1:3 and particularly preferably in the region below 1.2:1. In specific embodiments of the present invention, it is even preferred for the core:shell weight ratio to be less than 1:1, a typical core:shell weight ratio being 2:3.

Further preferred features of the invention relate to the control of the viscosity of the material at various stages of the process. The present inventors have realised that it would be advantageous for the precursor composite material to be more easily processable. Typical materials disclosed above are processed via melt-extrusion in which the temperature of the core-shell particles is increased above Tg of the shell material, typically at about 150°. However, even at this temperature, the material can be extremely viscous. It is therefore difficult to extrude films that are both thin and wide.

The present inventors have carried out detailed work to address this problem. Several approaches have been considered in order to improve the processability without adversely affecting the properties of the final composite optical material.

The process of the invention preferably includes the step of forming a layer of precursor composite material between the first and second sandwiching layers. This forming process can be by various means, or combinations of means, e.g. extrusion, coating, printing, film deposition, etc. As discussed above, the precursor composite material typically comprises a population of core-shell particles, each particle comprising a core and a shell material surrounding the core. Preferably, the process includes adding a viscosity-reducing agent to the population of core-shell particles to provide a reduced-viscosity composition. The viscosity is reduced in the sense that the composition including the viscosity-reducing agent has a lower viscosity than the composition not including the viscosity-reducing agent when tested under the same conditions. Then the reduced-viscosity composition can be formed into a layer between the first and second sandwiching layers. In this way, the formability of the precursor composite material can be improved. This allows an improvement in manufacturing efficiency of the composite optical material.

Rather than specifying the viscosity (in Pa·s) of the viscosity-reduced composition, it is preferred to consider the melt flow rate (MFR, or melt flow index) of the viscosity-reduced composition. MFR is an industrially-used figure of merit in the fields of plastics extrusion and injection moulding. A melt flow indexer measures the flow of a polymer "melt" under pressure through a die. The measurements are made at a specified temperature appropriate to the "melt" (e.g. 90° C.) under an appropriate load (e.g. 21.6 kg) and with a die of standard geometry L/D=8 mm/2.095 mm. According to ISO 1133, the measurement procedure is a displacement-measurement method, to provide a melt volume-flow rate. This may be expressed in milliliters per minute.

Preferably, the MFR of the viscosity-reduced composition is 1 mL/min or higher (e.g. 10 mL/min or higher), when measured at the forming temperature (e.g. 90° C.) under a load of 21.6 kg. This compares with a much lower MFR for the corresponding composition not subjected to viscosity reduction, e.g. 0.1 mL/min or lower under the same testing conditions.

There are various approaches to the selection of the viscosity-reducing agent. It is preferred that, although the viscosity is reduced during the processing of the material, the viscosity of the final material is not so low as to cause problems, e.g. in terms of stickiness of the final material, or lack of mechanical strength or durability. It is strongly preferred for the viscosity-reducing agent to be miscible with the core-shell particles.

In one approach, the viscosity-reducing agent may be removed from the composition after step (c) to increase the viscosity of the precursor composite material. For example, the viscosity-reducing agent may be removed from the composition by evaporation, optionally under reduced pressure. In this case, the viscosity-reducing agent may be a volatile solvent. Typically, the solvent has a boiling point of at most 100° C., at most 90° C., at most 80° C., or at most 70° C. The boiling point is also sufficiently high such that the solvent does not evaporate from the composition during the preceding processing steps. A solvent may be selected based on the temperature at which steps (b) and (c) are preferably carried out. The boiling point of the solvent will be above the processing temperature.

In another approach, which is more preferred, the viscosity-reducing agent may be modified in situ in the composition after step (c) to increase the viscosity of the precursor composite material. In this way, the viscosity-reducing effect of the viscosity-reducing agent may be minimised or neutralised. For example, the viscosity-reducing agent may be modified by cross-linking and/or polymerisation. Such reactions may be stimulated by one or more of heat, radiation, pressure, humidity, etc. Heat or radiation are preferred. UV radiation is most preferred because it allows the use of a clean process with low emissions. Thus, additionally a photoinitiator is preferably included in the reduced-viscosity composition. The viscosity-reducing agent is preferably liquid monomer or prepolymer. Typically the monomer has a molecular weight of 1000 g/mol or lower, but the molecular weight is not considered to be particularly important. Of greater importance is that the monomer has at least one reactive functional group (more preferably one or several groups capable of polymerisation) and is liquid under the processing conditions. There is no particular limit on the boiling point, provided that it is higher (and preferably substantially higher) than the temperatures used during processing.

Suitable monomers or prepolymers may be those known for use in forming UV curable coating materials, such as products from Sartomer ("photocure oligomers") e.g. liquid epoxy acrylates, urethane acrylates, ester acrylates and methacrylates.

Typically, the material of the shell surrounding each core is grafted to the core via an interlayer. Thus, in the core-shell particle, the shell polymer is a grafted polymer. In another approach addressing the processability of the material, the viscosity-reducing agent may be a non-grafted polymer of similar composition to the material of the shell. Preferably, in this case, the viscosity-reducing agent has a molecular weight lower than that of the material of the shell.

The improvement in formability of the composition by reducing the viscosity allows the process of the invention to be carried out more efficiently. For example, the process can be carried out at a temperature range similar to those identified above (where a viscosity-reducing agent is not used) but using lower forming forces (e.g. lower extrusion force). However, more preferably, the temperature used during the process is lower. For example, preferably the sandwich structure is formed at a temperature of 120° C. or less. More preferably, the sandwich structure is formed at a temperature of 110° C. or less, 100° C. or less, 90° C. or less or 80° C. or less. The use of these lower temperatures is advantageous because it makes the process much better suited to industrial scale manufacture and reduces the risk of thermal degradation of components of the precursor composite material.

Still more advantageously, the reduction in viscosity allows a very significant improvement of the processing speed, in terms of the length of precursor composite material that can be manufactured per minute. As an example, a typical process carried out with viscosity reduction formed the precursor composite material at a speed of 0.2 m/min. However, with the addition of the viscosity-reducing agent, speeds of 2 m/min worked well. Even at speeds of 5 m/min, the formation of structural colour was observed. The improvement is particularly significant in terms of efficient and cost-effective manufacture of the composite optical material. The processing temperature used may be any temperature that is suitable, provided that it is not so high as to cause deleterious softening of the sandwiching layers, or unwanted polymerisation of any component of the composite material. Thus, a temperature less than 180° C. is preferred, e.g. 170° C. or less, 160° C. or less, 150° C. or less, or 140° C. or less.

The reduction in viscosity also allows the ordering of the cores to be carried out more easily. Thus, steps (b) and (c) may be carried out at a temperature of 120° C. or less. More preferably, steps (b) and (c) may be carried out at a temperature of 110° C. or less, 100° C. or less, 90° C. or less, 80° C. or less, 70° C. or less, 60° C. or less, 50° C. or less, 40° C. or less or 30° C. or less. Most preferably, steps (b) and (c) may be carried out at room temperature. As indicated above, however, higher temperatures may be used where they are industrially advantageous for a high volume manufacturing approach.

Furthermore, the repetition of steps (b) and (c) may be reduced by the reduction in viscosity of the precursor composite material. For example, preferably the number of shear strain cycles is 20 or fewer.

The amount of viscosity-reducing agent to be added can be specified in terms of the weight of core-shell particles. Preferably, the amount of viscosity-reducing agent added is 30 wt % or less (more preferably 15 wt % or less, 10 wt % or less or 5 wt % or less. This gives a balance between providing suitable change in the viscosity and avoiding adversely affecting the ordering of the particles in the composite optical material.

The present inventors have realised that the approach of using a viscosity-reducing agent in the manner set out above is an important development in the field of polymer opals. Accordingly, it constitutes an independent aspect of the invention, in which a process for the manufacture of a composite optical material is provided, in which a precursor composite material is formed into a layer between the first and second sandwiching layers by the steps:

providing a population of core-shell particles, each particle comprising a core and a shell material surrounding the core;

adding a viscosity-reducing agent to the population of core-shell particles to provide a reduced-viscosity composition;

causing the reduced-viscosity composition to be formed into a layer between the first and second sandwiching layers; and ordering the particles to develop structural colour behaviour.

Any of the optional features set out above in relation to other aspects of the invention may be combined (singly or in any combination) with this aspect of the invention.

During the shearing of the precursor composite material, the ordering of the core particles gradually improves. It is typical in polymer opal materials for the core particles to self-arrange into a close packed arrangement. Typically this is an fcc arrangement, although rcp (random close packing) or twinned fcc arrangements are possible. A close packed plane (a {111} plane for an fcc arrangement) is typically formed parallel to the sandwiching layers. Furthermore, the direction of shear (i.e. the direction along which the first and second sandwiching layers are displaced relative to each other) typically corresponds to a close packed direction (a <110> direction for an fcc arrangement) in the close packed arrangement.

However, the present inventors have found that where the direction of shear is substantially the same from shear cycle to shear cycle for the entire ordering process, there is a risk of development and growth of crystal defects and/or structural defects in the periodic arrangement of core pellicles. Without wishing to be bound by theory, these are thought to be due to the consistent shear direction allowing minor crystalline defects (e.g. dislocations) to grow and/or accumulate with the result that the final product may include an observable optical defect. Furthermore, it is found that using a consistent shear direction results in a requirement for a relatively large number of shear cycles in order to develop a suitably periodic arrangement to exhibit high quality structural colour effects. In order to address these problems, which to the present inventors' knowledge have not been observed or considered in the art to date, the present inventors have found that an alteration of the shear direction from one shear cycle to another can provide beneficial effects. These beneficial effects relate to the reduction in the number of required shear cycles, the improvement in ordering of the core particles and/or the reduction of the size and/or number of observable defects in the composite optical material.

Accordingly, it is preferred that in at least one of the repetitions of step (b) after step (c), the direction of shear is changed. It is intended here that the change in the direction of shear is preferably not antiparallel to the original direction of shear, i.e. that the change is an angle different to 180°.

Most preferably, where an initial direction of shear corresponds to a close packing direction, the subsequent, different direction of shear corresponds to a direction which differs from the initial direction of shear by at least 5°. More preferably, the subsequent direction of shear differs from the initial direction of shear by at least 10°, still more preferably at least 15° and still more preferably at least 20°. A difference of about 30° has been found to be beneficial. It is to be noted that in an fcc lattice, a direction of 30° from a close packing direction does not correspond to another close packing direction, but is intermediate (halfway in this case) between different close packing directions. However, the subsequent direction of shear may be a close packing direction in some embodiments. In that case, the difference in shear directions may be about 60°. As will be understood, it is preferred that the subsequent direction of shear is contained within a close packing plane.

More than one subsequent direction of shear may be used. For example, a positive angle for the first subsequent direction of shear may be used from the initial direction of shear. Next, a negative angle for the next direction of shear may be used. Thus, in a preferred embodiment, the direction of shear may be varied between 0°, +30° and −30°, for example.

In preferred embodiments of the invention, the different directions of shear are provided using one or more rollers. Using two or more rollers allows the process to be run continuously. For example, a first roller may be angularly offset from a second roller by an angle corresponding to the required difference between the initial shearing direction and the subsequent shearing direction. Suitable roller arrangements will be apparent to the skilled person in order to provide more complex continuous rolling which provides a sequence of different shearing directions.

The variation in shear direction is also found to provide surprisingly advantageous results when combined with the use of a viscosity-reducing agent as set out above. The result is that the colour intensity provided by the composite optical material is stronger and the number of strain cycles required to achieve the required structural colour intensity can be reduced to a low number—as low as about 4 in some cases.

Furthermore, it is found that the variation in shear direction in the manner set out above is an important development in the field of polymer opals. Accordingly, it constitutes an independent aspect of the invention, in which a process for the manufacture of a composite optical material is provided, the composite optical material comprising a three dimensionally periodic arrangement of core particles in a matrix material, including the steps:

providing a sandwich structure of a precursor composite material held between first and second sandwiching layers, wherein the precursor composite material comprises a dispersion of core particles in matrix material;

for at least part of the sandwich structure, imposing a relative shear displacement in a first direction between the first and second sandwiching layers, thereby providing a shear strain in the first direction in the precursor composite material; and for at least part of the sandwich structure, imposing a relative shear displacement in a second direction between the first and second sandwiching layers, thereby providing a shear strain in the second direction in the precursor composite material, wherein the angle between the first direction and the second direction is at least 5°.

Any of the optional features set out above in relation to other aspects of the invention may be combined (singly or in any combination) with this aspect of the invention.

The present inventors have further realised that aspects of the present invention may be applied to other materials than polymer opal materials. In particular, it may not be necessary in some embodiments to use an arrangement of core-shell particles in order to develop structural colour.

Of particular interest here are composite optical materials formed using block copolymers. Parnell et al [A. J. Parnell et al "Continuously tuneable optical filters from self-assembled block copolymer blends", Soft Matter, 2011, 7, 3721] disclose the blending of two symmetric high molecular weight diblock copolymers (poly(styrene-b-isoprene) (PS-b-PI)) of different molecular weights. The precursor material is shear aligned to form a one dimensional Bragg reflector. The thickness of the precursor material was 80 µm. Shear ordering was via manual oscillatory motion. The content of Parnell et al is hereby incorporated by reference in it entirety.

Similarly, Chan et al [E. P. Chan et al "Block copolymer photonic gel for mechanochromic sensing" Advanced Materials, Volume 23, Issue 40, pp. 4702-4706 (2011)] disclose a symmetric polystyrene-b-poly-2-vinylpyridine (PS-b-P2VP) diblock copolymer self-assembled into a one dimensional lamellar stack. The content of Chan et al is hereby incorporated by reference in it entirety.

Given the disclosure in the art that composite optical materials may be formed from block copolymers using shear-ordering, the present inventors consider that the principles of the present invention can be applied to such materials.

Accordingly, in a further aspect of the invention, there is provided a process for manufacturing a composite optical material comprising a periodic arrangement of two or more components, the arrangement exhibiting structural colour, the process including the steps:

(a) providing a sandwich structure of a precursor material held between first and second sandwiching layers, wherein the precursor material comprises a mixture of said two or more components;

(b) for at least part of the sandwich structure, imposing a relative shear displacement between the first and second sandwiching layers, thereby providing a shear strain of at least 10% in the precursor material;

(c) after step (b), reducing the relative shear displacement between the first and second sandwiching layers in order to reduce the shear strain in the precursor material, wherein the process includes repeating step (b) after step (c) at least once, the repeating shear strain promoting ordering of said two or more components to convert the precursor material to the composite optical material.

In some embodiments, the periodic arrangement may be a one dimensional periodic arrangement. For example, in the composite optical material, the two or more components may be arranged into alternating lamellae.

Preferably, the precursor material comprises a block copolymer, said two or more components corresponding to respective different parts of the block copolymer.

The inventors consider that other features of the invention may be applied to this aspect of the invention. In particular, preferably in at least one of the repetitions of step (b) after step (c), the direction of shear is changed.

Any of the optional features set out above in relation to other aspects of the invention may be combined (singly or in any combination) with this aspect of the invention.

Further optional features of the invention are set out below.

BRIEF DESCRIPTION OF THE DRAWINGS

Preferred embodiments of the invention will be set out by way of example with reference to the drawings, in which:

FIG. 24 shows tensile test results for pressed polymer opal disks cured for 20 mins using an Osram Vitalux lamp. FIG. 25 shows tensile test results for pressed polymer opal disks containing benzophenone cured for 2×3 mins using UVCube lamp 100 W/cm².

FIG. 31: UVCube 100 W/cm, 2×30s irradiation time).

FIG. 37 shows the effect of curling on reflection intensity (ordering of the particles in the material), when the shear direction is maintained at 0°.

FIG. 38 shows the effect of curling on reflection intensity (ordering of the particles in the material), when the shear direction is altered between 0° and 30°.

DETAILED DESCRIPTION OF THE PREFERRED EMBODIMENTS, FURTHER OPTIONAL FEATURES OF THE INVENTION

The entire content of each the documents referred to in any section of this disclosure is hereby incorporated by reference.

Suitable Materials for Polymer Opals

The preferred polymer opals disclosed here are based on flexible monolithic photonic crystals formed from hard polymer spheres dispersed in a softer sticky elastomer matrix. See Pursianinen et al (2007) [O. L. J. Pursianinen, J. J. Baumberg, H. Winkler, B. Viel, P. Spahn, T. Ruhl, Optics Express 15, 9553 (2007)] and Pursianinen et al (2008) [O. L. J. Pursianinen, J. J. Baumberg, H. Winkler, B. Viel, P. Spahn, T. Ruhl, Advanced Materials 20, 1484 (2008)]. As typical for opaline photonic crystals [References 14-16], when the spheres self-assemble into an fcc lattice they can be colour-tuned by changing the size of the constituent spheres. See Vlasov et al (2000) [Y. Vlasov, V. Astratov, A. Baryshev, A, Kaplyanskii, O. Karimov, M. Limonov, Phys. Rev. E 61, 5784 (2000)], Romanov et al (2001) [S. Romanov, T. Maka, C. Sotomayor Torres, M. Muller, R. Zentel, D. Cassagne, J. Manzanares-Martinez, C. Jouanin, Phys. Rev. E 63 56603 (2001)] and McLachlan et al (2004) [M. McLachlan, N. Johnson, R. De La Rue, D. McComb, J. Mat. Chem. 14, 144 (2004)]. Using spheres of diameter about 200 nm produces Bragg peaks in the visible spectral range, whilst the elastomeric composition gives flexible films with enhanced structural control of colour. A major strength of this work is the ability to form these opals by shear-assembly which allows efficient production on industrial scales.

Optical scattering spectra of different samples reported in this disclosure were quantified by mounting them on a stage and recording confocally-collected dark-field spectra on a modified microscope. Data was normalised to the scattering spectra taken under identical conditions on white diffuser plates which have a broadband Lambertian spectrum. The samples were analysed using a 5× objective lens with a numerical aperture of 0.15.

Shear Ordering of Core Particles

Figure 1:
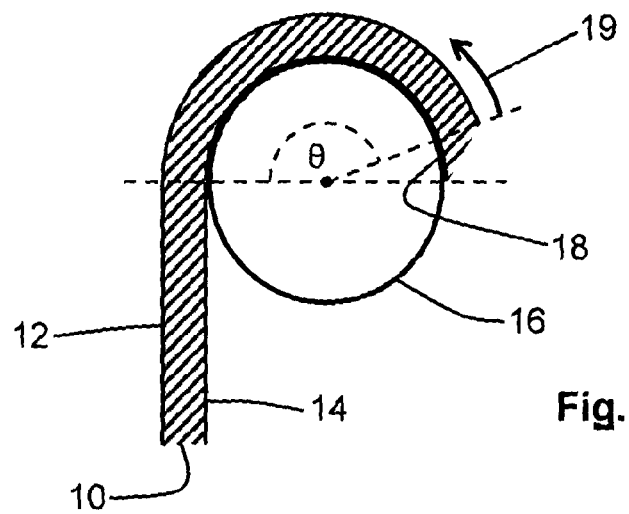
FIG. 1 shows a schematic view of a manufacturing process according to an embodiment of the invention, illustrating the contact angle $\theta$.

FIG. 1 shows a schematic view of a manufacturing process according to an embodiment of the invention. A polymer opal layer 10 (composite optical material or precursor composite material) is held between an outer foil 12 and an inner foil 14 (first and second sandwiching layers), to form a sandwich structure. In the drawing, it is intended that the outer foil 12 and the inner foil 14 have the same length. The sandwich structure is passed around a roller 16. The contact angle between the sandwich structure and the roller is defined as θ, where θ is the angle subtended at the centre of the roller between the locations on the roller between which the sandwich structure makes contact with the roller, (Note that, beyond θ, the inner foil 14 is shown in FIG. 1 as keeping in contact with the roller, but this is for illustrative purposes only.)

Provided that the outer foil does not stretch relative to the inner foil, the free ends of the outer foil and the inner foil are offset by an overhang 18, because the radius of curvature of the inner foil is different to that of the outer foil. Therefore overhang 18 amounts to a shear displacement between the inner and outer foils, this giving rise to a shear stress indicated by arrow 19 on the polymer opal layer.

Figure 2:
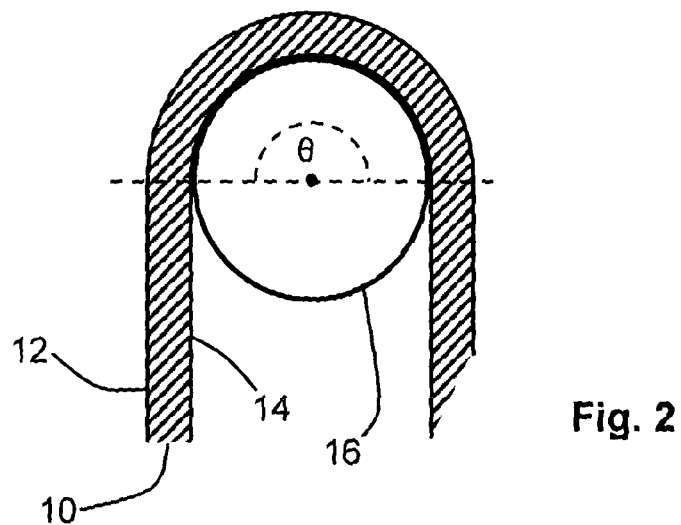
FIG. 2 shows a modification of FIG. 1 in which $\theta=\pi$.

FIG. 2 shows a similar view to FIG. 1 except that the contact angle θ here is π radians, because the entire structure passes for a full half turn around the roller 16.

Figure 3:
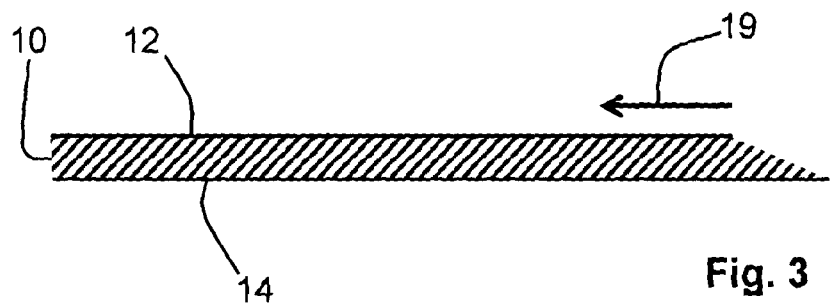
FIG. 3 illustrates the shear strain applied to the polymer layer by a notional linear equivalent of FIGS. 1 and 2.

In each of FIGS. 1 and 2, the schematic views show the relative displacement of the inner and outer foils being zero at one end of the structure and a maximum and the opposite end of the structure. This is illustrated schematically in FIG. 3, with the notional equivalent straight polymer opal layer 10 subjected to a shear stress 19 by relative displacement of the inner foil 14 and outer foil 12.

The polymer opal layer between the inner and outer foils is in contact with and bonded to the inner and outer foils. Thus, the shear displacement between the inner and outer foils applies a shear stress on the polymer opal layer and thus a shear strain. It is possible to calculate the shear strain in the polymer opal layer as follows.

Taking the thickness of the polymer opal layer to be 100 μm (0.1 mm), and the inner radius of curvature of the polymer opal layer to be 10 mm (around the contact angle θ), the outer radius of curvature of the polymer opal layer is 10.1 mm. Taking θ to be π radians (3.141593 radians) (i.e. 180°), the length of the outer surface of the polymer opal layer subjected to curvature around θ is 31.73009 mm. The contact angle of an equal length of the inner surface of the polymer opal layer is 3.173009 radians. The overhang is therefore 0.031416 radians, i.e. 0.314159 mm. The overhang corresponds to the shear displacement. The shear strain applied to the polymer opal layer is therefore (shear strain thickness), i.e. 314.159%.

The calculation above assumes that the polymer opal layer does not change thickness in response to the shear stress. The calculation above also assumes that the inner and outer foils are perfectly flexible and have a Young's modulus which is very significantly greater than that of the polymer opal, so that any stretching of the outer foil can be ignored. However, it is noted that in order to relive the shear strain in the polymer opal layer, it would only be necessary for the outer foil to have a tensile strain of 0.99% in the example shown (specific to the radius used in this example. Compression in the inner foil would have a similar effect. Therefore it is important to give consideration to the mechanical properties of the foils, and to minimize any effect of the process on allowing relaxation of the shear stress on the polymer opal, other than the crystallization of the polymer opal itself.

Figure 4:
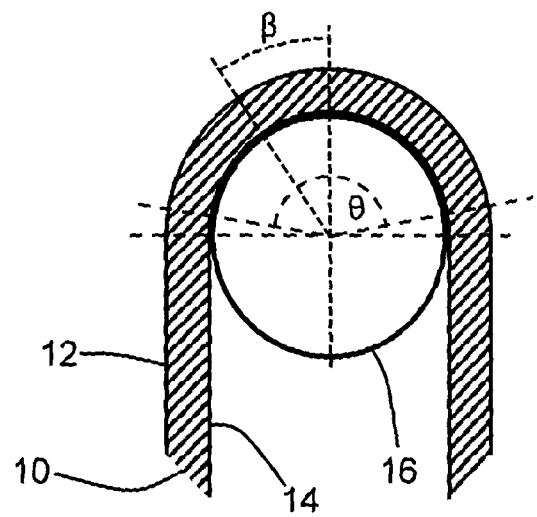
FIGS. 4-6 show schematic view of a manufacturing processes according to a preferred embodiment of the invention, in which the curling of the precursor composite material in the sandwich structure is reversed.
Figure 5:
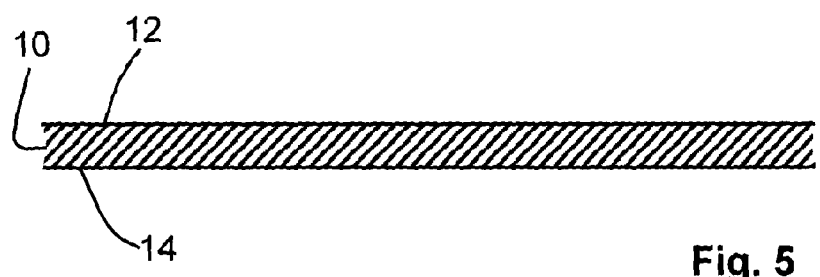
Figure 6:
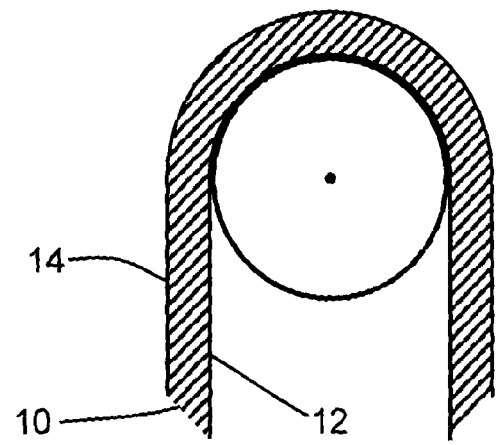

FIGS. 4-6 show further considerations of the shear strain in the polymer opal layer in more detail.

In FIG. 4, contrary to what is shown in FIGS. 1 and 2, the shear strain is not accommodated only at one end of the sandwich structure, but instead is allowed to be taken up at both ends of the sandwich structure. The general situation is illustrated, in which the contact angle θ is slightly less than π radians. The angle β can be considered to be an angle indicating the position of interest in the sandwich structure.

FIGS. 4, 5 and 6 illustrate a complete strain cycle including both the curling (FIG. 4), straightening (FIG. 5) and reverse-curling (FIG. 6) process. The polymer opal film 10 is shown between the first foil (sandwiching layer) 12 and the second foil (sandwiching layer) 14. The thickness of the polymer opal layer is exaggerated to assist the illustration. FIG. 5 illustrates the state of the opal film after the curling process in FIG. 4. It can be seen from FIG. 5 that the ends of the polymer opal layer are distorted slightly due to the shear strain experienced in FIG. 4. The sandwich structure is then reversed and curled as shown in FIG. 6, with the second foil 14 now the outer foil and the first foil 12 now the inner foil. Then the sandwich structure is straightened again to have the form shown in FIG. 5.

The sample is repeatedly curled on a stationary roller as shown in FIGS. 4-6. In order to simplify the understanding of the process, in this section we assume the (PET) foils on both sides of the polymer opal film to be perfectly bendable but not stretchable or compressible. Only in-plane shear force on the polymer opal film is considered. Therefore, shear strain of a random point on the film (see FIG. 4) can be expressed in the following equation:

$$\gamma = \tan(\alpha) = \begin{cases} \dfrac{\theta}{\pi} \times \dfrac{\pi(2d+t)}{2t}, & \pi/2 \leq \beta \leq 3\pi/2 \\ \dfrac{\theta}{\pi} \times \dfrac{\beta(2d+t)}{2t}, & -\pi/2 < \beta < \pi/2 \end{cases} \quad (0 < \theta \leq \pi)$$

γ is the shear strain, β is the position angle, d is the thickness of the PET foil and t is the thickness of the opal film. This equation means shear strain is independent of the curvature of the roller, only depends on the contact angle and the thickness of the opal film as well the PET foil, and different areas of the opal film subject to different shear strain, depending on the position angle. Except the ends of the film, any point in the film will subject to a V-shape oscillatory shearing force curve with modulated amplitude at the beginning and the end of the period. Without taking into account the transition process illustrated in FIG. 5, the oscillation frequency should be approximately 1 Hz in practice, and each curling cycle contains one oscillation period.

Based on these basic calculations, it is possible to predict some useful processing parameters.

Figure 7:
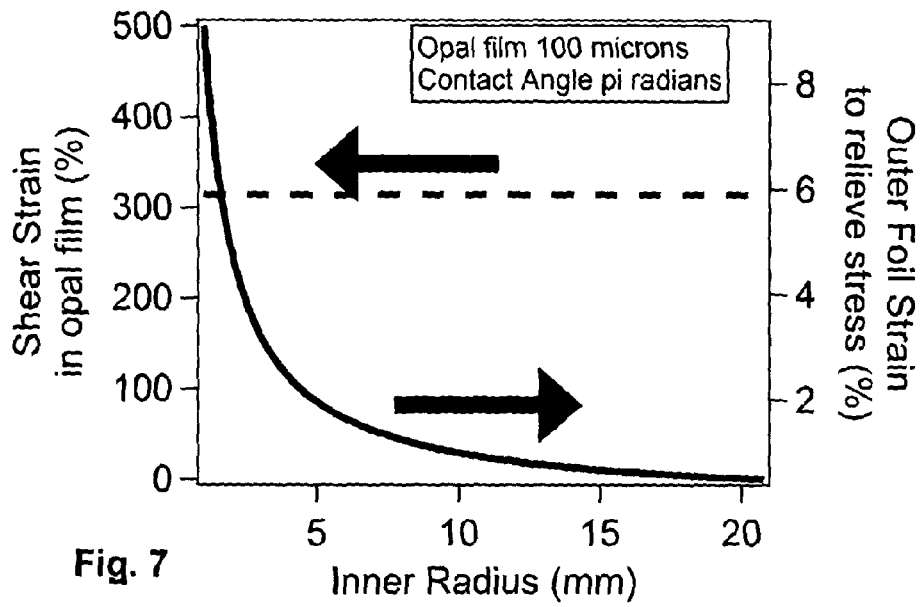
FIG. 7 shows the effect of the inner radius of the polymer opal on the shear strain in the polymer opal film and the strain that would be required in the outer foil in order to relieve the shear stress in the polymer opal film.

FIG. 7 shows the effect of the inner radius of the polymer opal on the shear strain in the polymer opal film and the strain that would be required in the outer foil in order to relieve the shear stress in the polymer opal film. In this plot, the contact angle is pi radians. It is shown that the inner radius does not affect the shear strain in the polymer film, but there is a significant effect on the required outer foil strain to relieve the stress.

Figure 8:
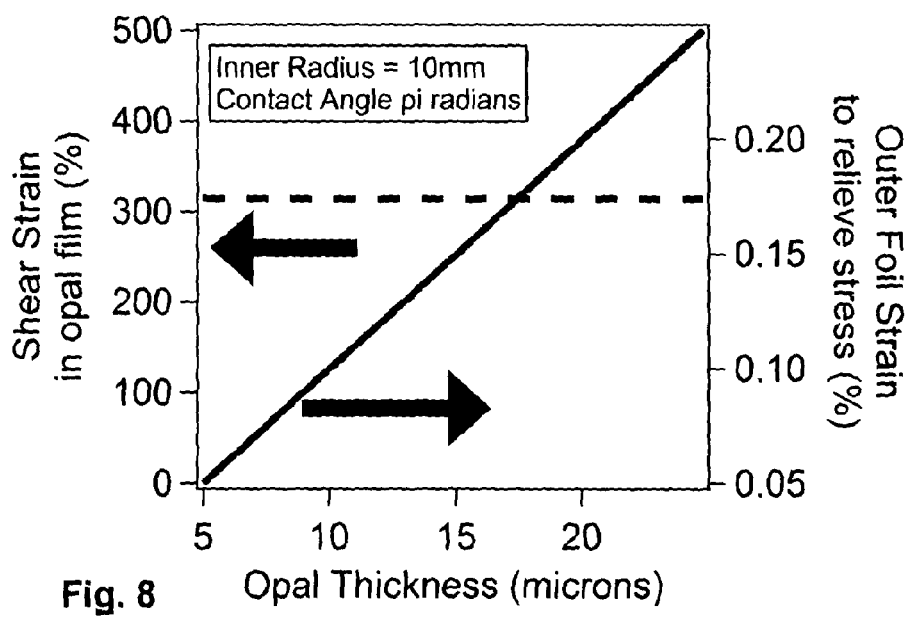
FIG. 8 shows the effect of the thickness of the polymer opal layer on the shear strain in the polymer opal film and the strain that would be required in the outer foil in order to relieve the shear stress in the polymer opal film.

FIG. 8 shows the effect of the thickness of the polymer opal layer on the shear strain in the polymer opal film and the strain that would be required in the outer foil in order to relieve the shear stress in the polymer opal film. In this plot, the inner radius is 10 mm and the contact angle is pi radians. The thickness of the polymer opal layer does not affect the shear strain. The thickness of the polymer opal layer does affect the strain required in the outer foil in order to relieve the stress in the polymer opal layer, but only to a small degree.

Figure 9:
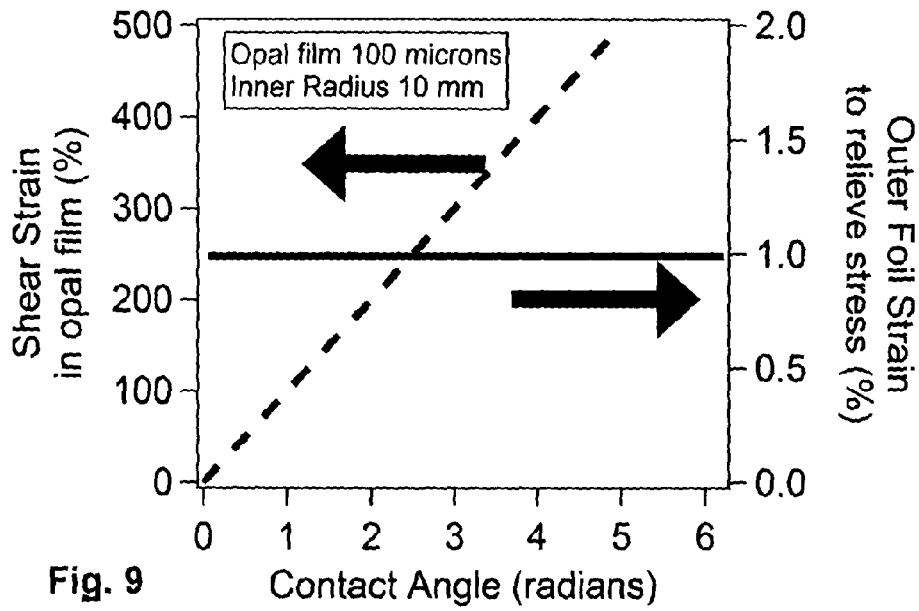
FIG. 9 shows the effect of the contact angle θ on the shear strain in the polymer opal film and the strain that would be required in the outer foil in order to relieve the shear stress in the polymer opal film.

FIG. 9 shows the effect of the contact angle θ on the shear strain in the polymer opal film and the strain that would be required in the outer foil in order to relieve the shear stress in the polymer opal film. The contact angle is considered to be the dominating parameter for the shear strain of the polymer opal film. A suitable level is considered to be about 100°. However, contact angles of about 180° are acceptable, and convenient to implement. The contact angle does not affect the strain that would be required in the outer foil in order to relieve the shear stress in the polymer opal film.

The amount of shear induced in the opal is independent of radius and opal thickness and only depends on the "contact angle" i.e. how far around the roller the film is in contact. For an indicative optimum shear amplitude of about 170%, this means that a contact angle of about 97° should be targeted, but with any contact angle from 28-170° producing a beneficial effect. However, in other embodiments, the contact angle can be many multiples of pi (e.g. greater than 2 pi or greater than 4 pi), and good results can still be obtained.

Based on these calculations, it can be concluded that contact angle is the main parameter in controlling shear strain in the polymer opal layer, and the radius of the roller is the main parameter in controlling the effect of outer foil stretching on relieving the shear stress in the polymer opal layer. The polymer opal layer thickness has no effect on the induced shear strain and only a small effect on the outer foil elasticity sensitivity. It is noted that thick polymer opal layers tend to layer when ordered because the distance from the templating effect of the interface between the polymer opal and the smooth sandwiching layer is increased. The rolling radius has no influence on the shear strain induced in the polymer opal but has a large influence on outer foil strain (and inner foil strain) below about 5 mm, therefore the foil thickness will set the lower radius limit. The outer foil elasticity is therefore very important in terms of determining the actual shear strain in the opal film. Any outer foil stretching or inner foil compression reduces the effective shear strain applied to the polymer opal film. For radii above about 10 mm, in the calculations presented here, the outer foil elasticity could completely counteract any bend induced shear. Therefore it is considered that a small roller radius is beneficial.

A large number of experiments has been carried out in order to investigate the effect of curling in more detail. In what follows, a cycle of curling (a strain cycle) requires that a sandwich structure of a first sandwiching layer, a precursor composite layer and a second sandwiching layer is passed around a roller of constant radius with a maximum contact angle of about 100° with the first sandwiching layer in contact with the roller so that it has a smaller radius of curvature than the second sandwiching layer. Next, the sandwich structure is passed around the same roller but with the second sandwiching layer in contact with the roller so that it has a smaller radius of curvature than the first sandwiching layer. In this way, the direction of the shear strain applied to the precursor composite material is reversed in the second part of the strain cycle.

Figure 10:
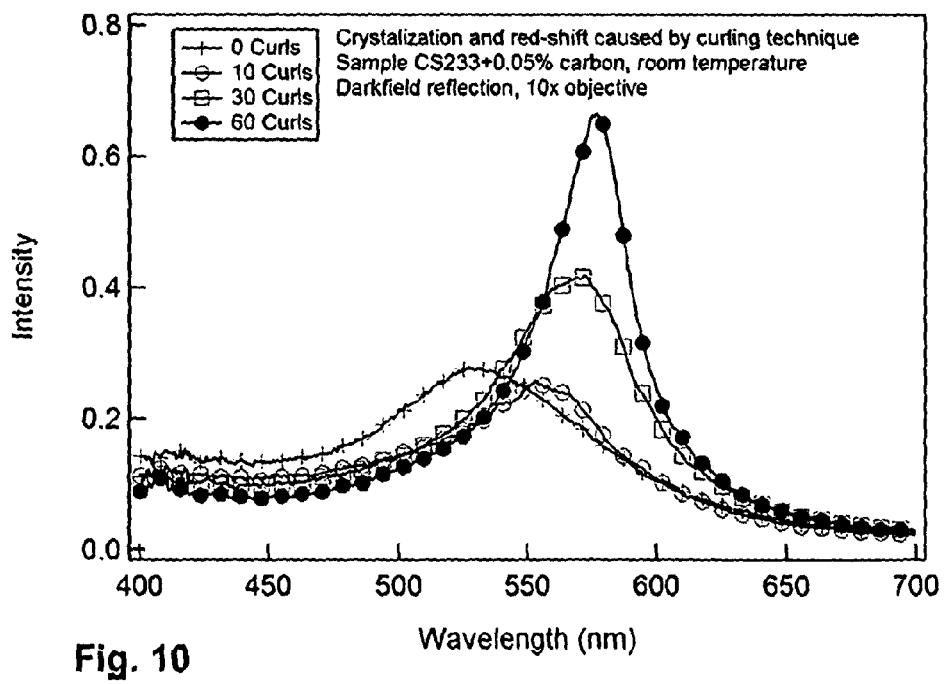
FIG. 10 shows darkfield intensity response in white light of samples which are identical except for their strain processing, expressed in terms of the number of "curls" or strain cycles to which they have been subjected.

Before considering the results of these experiments in detail, we consider FIG. 10. This shows the darkfield intensity response (10× objective) in white light of samples which are identical except for their strain processing, expressed in terms of the number of "curls" or strain cycles to which they have been subjected. These results show that the amount of light reflected from the samples at specific wavelengths increases as the number of strain cycles increases. There is also seen a shift in the peak reflection wavelength as the number of strain cycles increases. This "red shift" is a feature of much of the data presented here and appears to occur in conjunction with the ordering (crystallisation) of the polymer opal. This tends to happen particularly with thicker samples (e.g. greater than about 50 µm thick) the samples presented here are typically 80-100 µm thick.

The results reported here are for samples formed from PEA-PMMA-PS core-shell structured polymer spheres with 0.05 wt % carbon nanoparticles. The mean diameter of the spheres was 233 nm. After extruding from an extruder, all of the samples were prepared on a roller rig for rolling (as explained above) or hot-edge process at a temperature of 150° C., otherwise stated. The thickness range for the samples was 80-100 µm, unless otherwise stated. Tg for the core PS particles was about 90° C., but the degree of crosslinking of the PS was sufficient (e.g. about 10% crosslinking density) that the material could be processed at about 150° C. without substantial deformation of the core particles.

Figure 11:
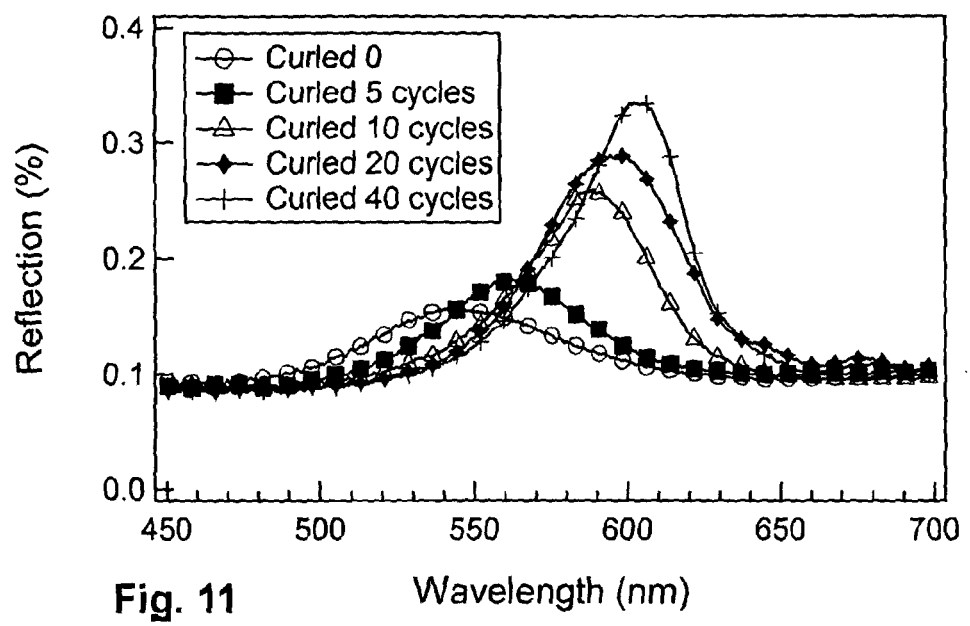
FIG. 11 shows darkfield spectra of curled samples before annealing.
Figure 12:
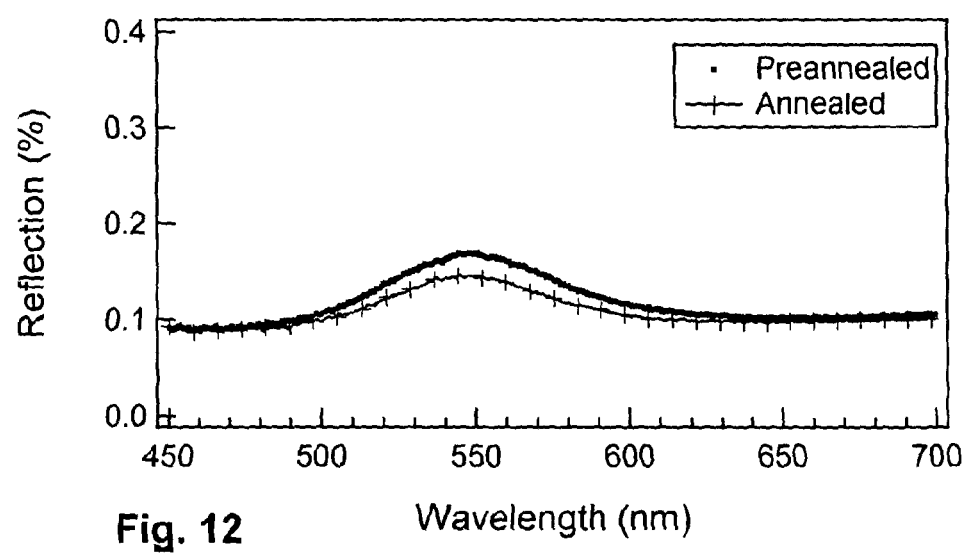
FIGS. 12-16 show darkfield spectra of curled samples before and after annealing.
Figure 13:
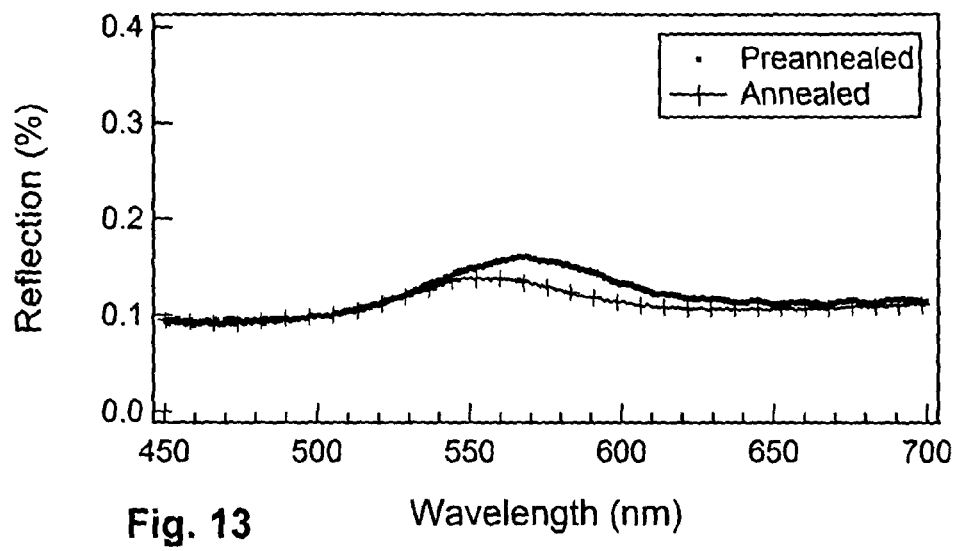
Figure 14:
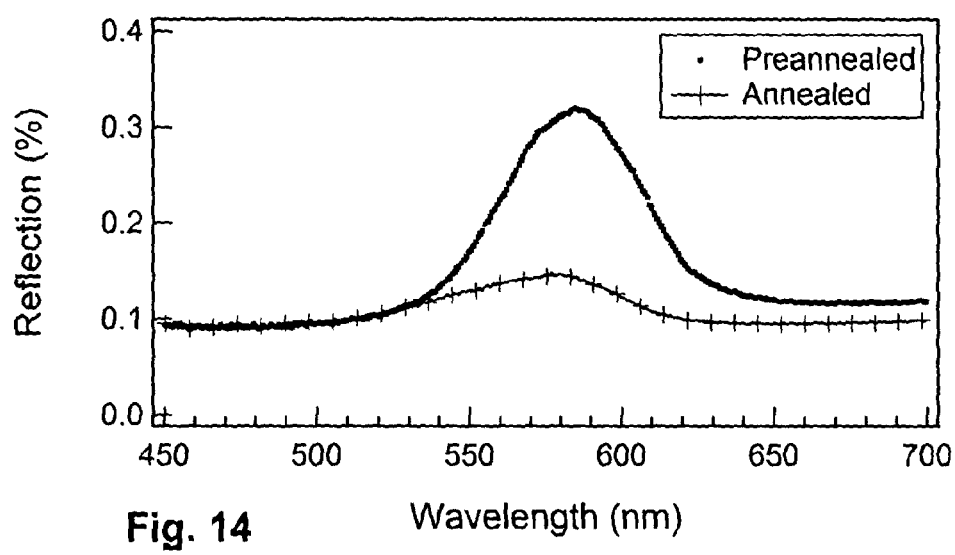
Figure 15:
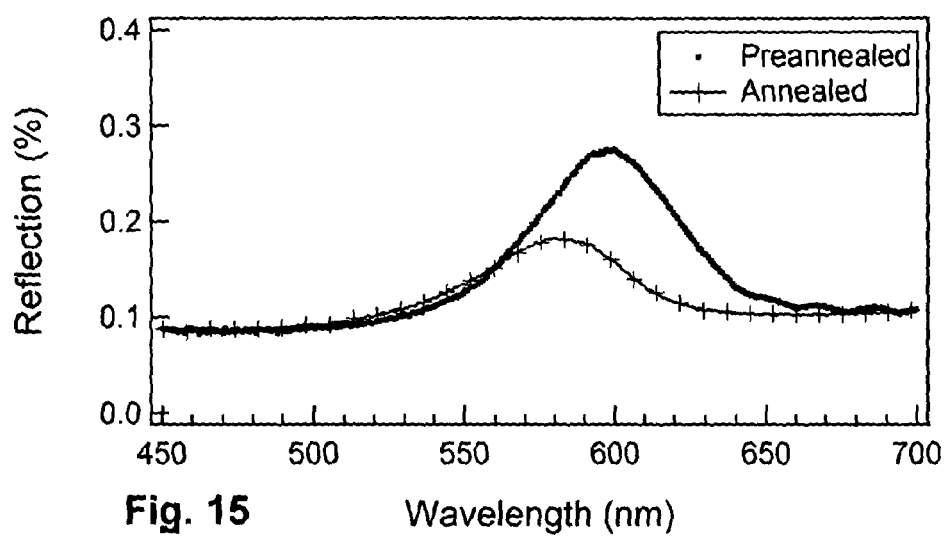
Figure 16:
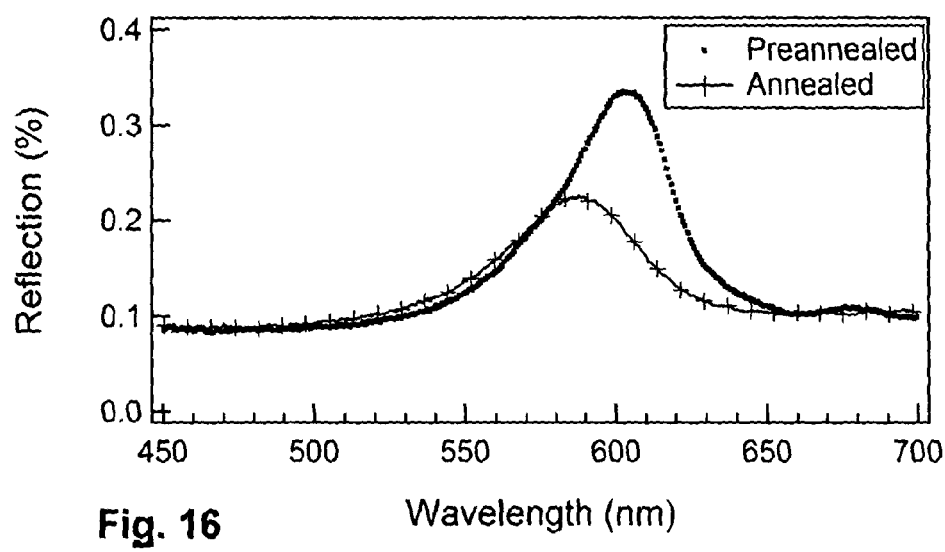

FIG. 11 shows the bright field spectra of curled samples before annealing, using a 20× objective and an Ocean Optics spectrometer. The samples were treated as follows (see Table 1):

TABLE 1

| Sample | Curl (times) |
| --- | --- |
| 0 | 0 |
| 1 | 5 |
| 2 | 10 |
| 3 | 20 |
| 4 | 40 |

The maximum response is shown by the samples curled 40 times.

Each sample was subjected to annealing at 130° C. for 30 seconds. The results are shown in FIGS. 12-16 for pre- and post-annealed samples 0, 1, 2, 3 and 4, respectively. In general, annealing is shown to reduce the maximum reflection for each sample.

Samples of a sandwich structure similar to that used for FIGS. 11-16 were treated in various ways in order to compare the effect of hot edge treatment with rolling. The sample treatment conditions are shown in Table 2. In the hot edge process, the radius of curvature of the outer sandwiching layer was 2-5 mm. The samples reported here were not subjected to annealing. Spectra were measured by using 10× objective, Optoelectronics Spectrometer, and then repeated on the same samples using 10× objective, Ocean Optics Spectrometer (considered to be more sensitive than the Optoelectronics Spectrometer.

TABLE 2

| Sample | Temperature (° C.) | Hot edge (H) or Roll (R) | Curl times |
|---|---|---|---|
| 1 | 150 | R | 0 |
| 2 | 150 | R | 5 |
| 3 | 150 | R | 10 |
| 4 | 150 | R | 20 |
| 5 | 150 | R | 30 |
| 6 | 150 | R | 40 |
| 7 | 150 | R | 60 |
| 8 | 150 | R | >=80 |
| 9 | 150 | H | 0 |
| 10 | 150 | H | 5 |
| 11 | 150 | H | 10 |
| 12 | 150 | H | 20 |
| 13 | 150 | H | 30 |
| 14 | 150 | H | 40 |
| 15 | 150 | H | 60 |

Figure 17:
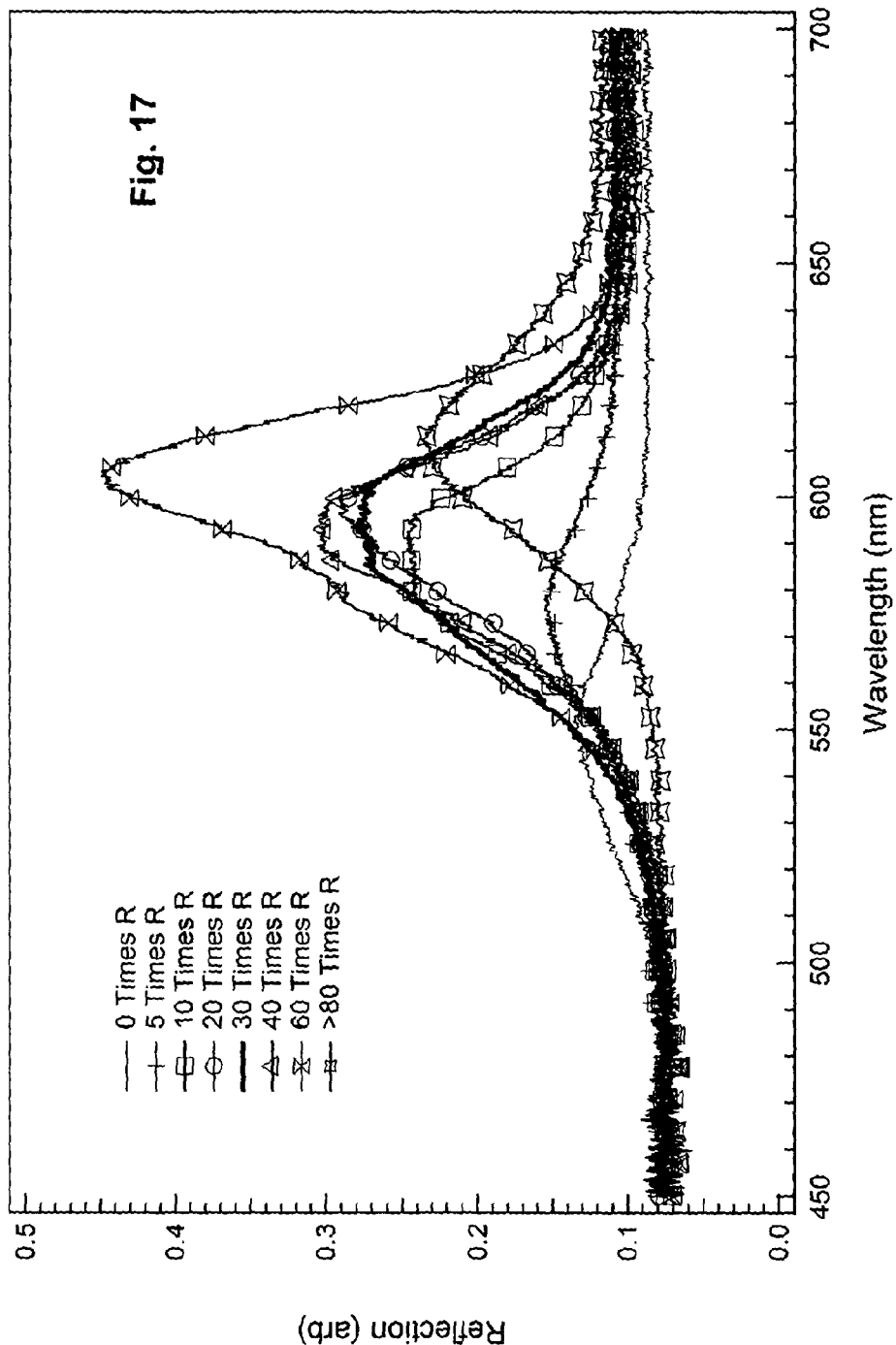
FIG. 17 shows averaged bright field spectra for various samples.

FIG. 17 shows averaged bright field spectra for various samples 1-8 in Table 2. A maximum response is seen for 60 strain cycles.

Figure 18:
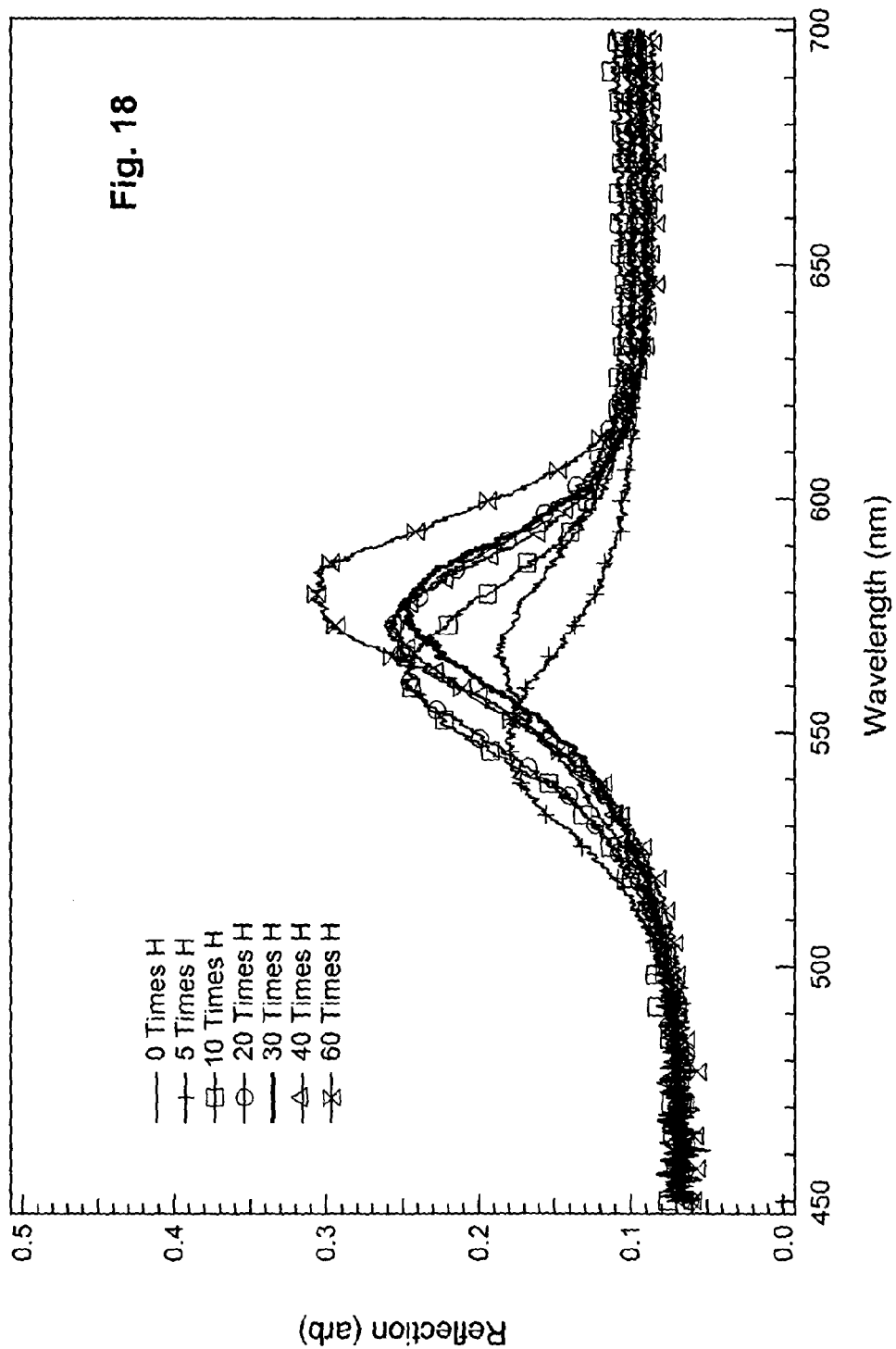
FIG. 18 shows averaged bright field spectra for hot edge samples. A maximum response is seen for 60 strain cycles.

FIG. 18 shows averaged bright field spectra for hot edge samples. A maximum response is seen for 60 strain cycles.

FIGS. 17 and 18 are plotted on identical scales. Therefore it is possible directly to compare the averaged bright field spectra for rolled and hot edge samples subjected to the same number of strain cycles. Thus, it is possible to compare samples 1 and 9, 2 and 10, 3 and 11, 4 and 12, 5 and 13, 6 and 14, and 7 and 15, respectively. The results show that at low numbers of strain cycles, the reflections from the hot edge samples have greater intensity than the reflections from the rolled samples. However, at about 20 strain cycles and higher, the reflections from the rolled samples have greater intensity than the reflections from the hot edge samples.

Further work was carried out to collect bright field, dark field and transmission spectra for samples 1-8 and samples 9-15 using the Ocean Optics Spectrometer.

The results showed that between 0-60 shear strain cycles, intensities as well as the peak wavelengths of bright field and dark field spectra increase with total number of strain cycles. Intensities of the bright field and dark field spectra of the rolled samples reach their highest values at 60 strain cycles times. However, although the peak wavelengths continue to increase in some cases very slowly with strain cycles above 60, the intensity of the bright field reflection peak decreases significantly, and at the same time the full width at half maximum (FWHM) increases.

The inventors have carried out further experiments to study the effect of the shear strain on the degree of formation of the periodic arrangement in the polymer opal.

Figure 19:
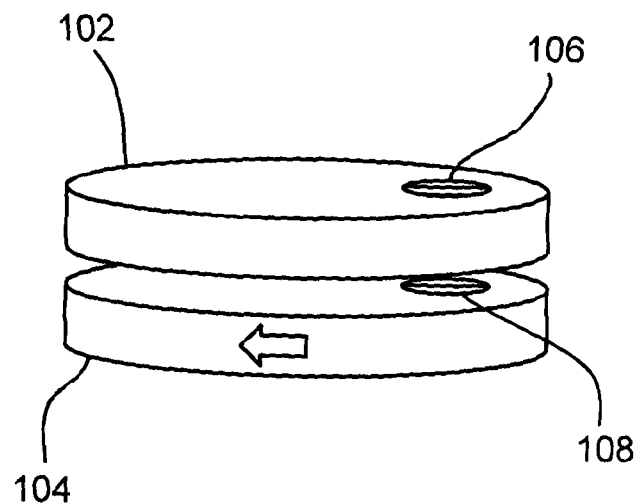
FIG. 19 shows a schematic view of the shear cell 100 used in experiments to assess the effect of the shear strain on the degree of formation of the periodic arrangement in the polymer opal.

FIG. 19 shows a schematic view of the shear cell 100 used in these experiments. The shear cell used was a Linkam CS450. A sample of the precursor composite material is placed in a gap between top plate 102 and bottom plate 104. Bottom plate 104 is moveable with respect to the top plate in order to generate shear strain in the precursor composite material. Viewing windows 106, 108 are provided in the top and bottom plates, respectively. Here, the strain is defined as positive or negative from a central zero position. At the zero position the sample is not deformed. Bottom plate 104 is moved until the required oscillatory strain is reached. The plate then moves back in the opposite direction, passing through zero, where the sample is undeformed, and then onwards until the strain is achieved in the opposite direction (e.g. +50%, through 0% and on to −50%).

The samples were treated as shown in Table 3.

TABLE 3

| Shear sequence step | Steady (S) or Oscillating (O) | Gap (μm) | Shear strain (%) | Shear rate (per second) | Frequency of oscillation (Hz) | Direction | Time (s) |
|---|---|---|---|---|---|---|---|
| 1 | S | 300 | na | 2 | na | Clockwise | 10 |
| 2 | S | 300 | na | 0.1 | na | Clockwise | 10 |
| 3 | O | 300 | 200% | na | 1 hz | Clockwise | 10 |
| 4 | O | 300 | 50% | na | 2 hz | Clockwise | 10 |

Step 1 of the shear sequence step in Table 3 is a pre-shear to randomise the precursor composite material this provides the base condition for subsequent steps.

Step 2 is a slow shear to relax elastic forces.

Step 3 is a large oscillation shear in order to promote "crystallisation", i.e. ordering of the particles. The "direction" here is the direction of the first part of the oscillation cycle.

Step 4 is a small oscillation shear to negate phase dependence.

A sequence of transmitted spectra was collected through the windows 106, 108 before the start of the shear sequence. The spectra overlayed each other over a 2 second period.

Next, a sequence of transmitted spectra was collected through the windows 106, 108 during a 3 second time period within step 1 of the shear sequence. The effect of step 1 was shown to increase the transmission of light between 400-580 nm. Also, the stop band 580-630 nm became narrower. It is considered that a side effect of crystallisation (increased ordering) in the polymer opal is less scatter in the polymer opal layer and wavelengths in outside the stop band experience enhanced transmission.

Two transmission spectra were collected during step 2 of the shear sequence. One was taken at the beginning of step 2 and one was taken at the end of step 2 (10 seconds later). This demonstrated a relaxation effect of the slow shear of step 2.

Next, a sequence of transmitted spectra was collected through the windows 106, 108 during a 10 second time period within step 3 of the shear sequence. The progression showed the earlier spectra having relatively low transmission compared with later spectra in the series. The effect is to allow greater transmission at some frequencies during step 3.

Repeating the shear sequence of step 3 enhances the effect seen.

A sequence of transmitted spectra were collected through the windows 106, 108 during a 10 second time period within step 3 of the shear sequence, but with the strain amplitude reduced to 25%. The overall effect of the shear was reduced compared with 200% strain amplitude.

Figure 20:
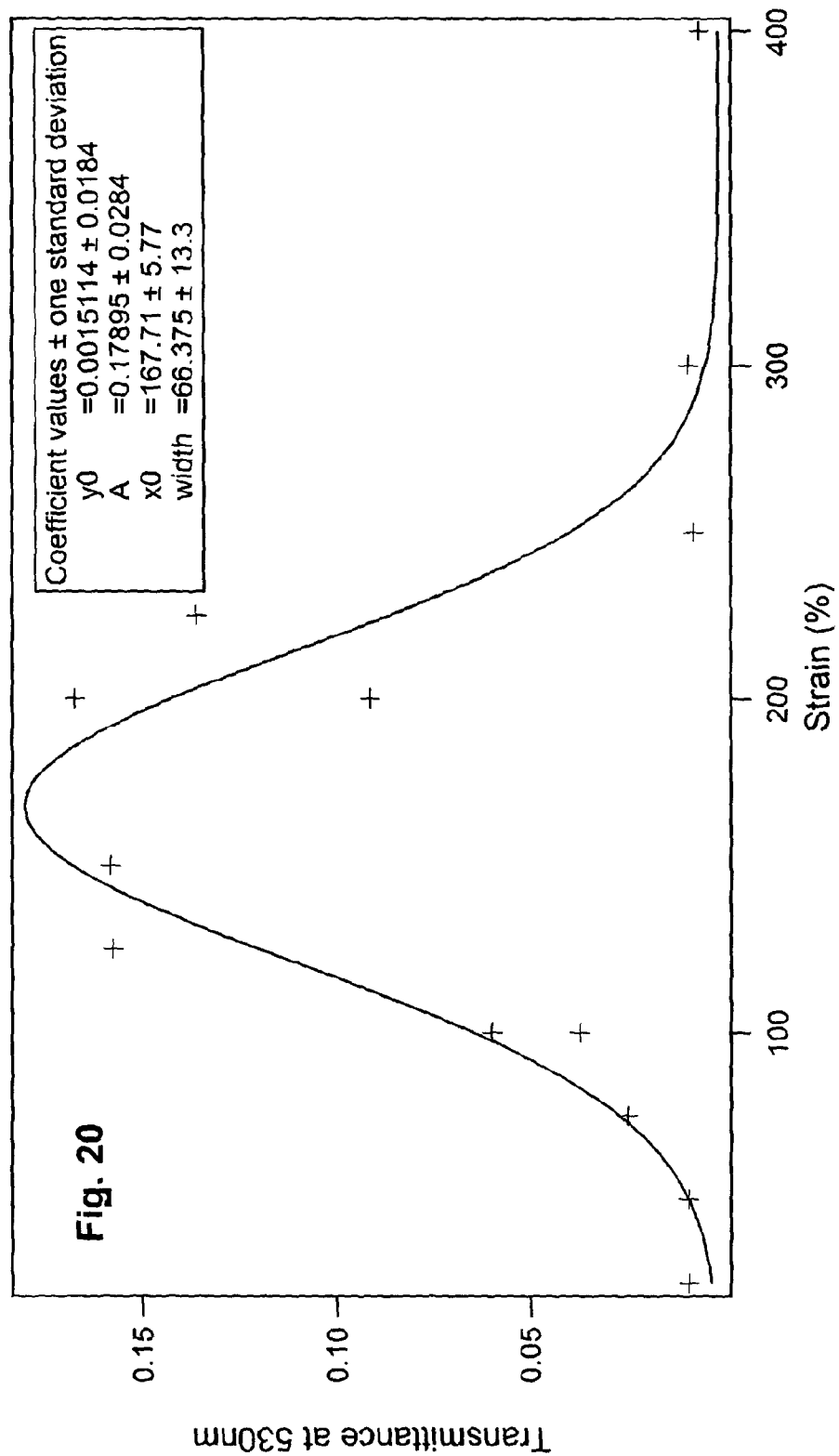
FIG. 20 shows the transmission through samples depending on the strain amplitude applied in step 3 of the shear sequence.

FIG. 20 shows the transmission through samples depending on the strain amplitude applied in step 3 of the shear sequence. A maximum effect can be seen at between 100% and 200% shear strain.

Figure 21:
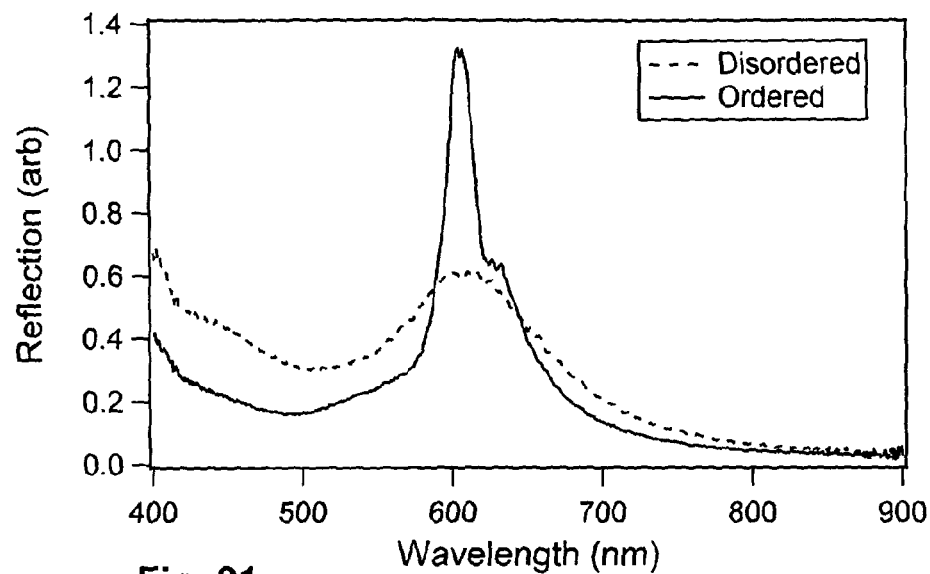
FIG. 21 shows a comparison between bright field intensity spectra in reflection for disordered (after step 1 of the shear sequence) and ordered (after a modified step 3). Sample thickness 300 µm.
Figure 22:
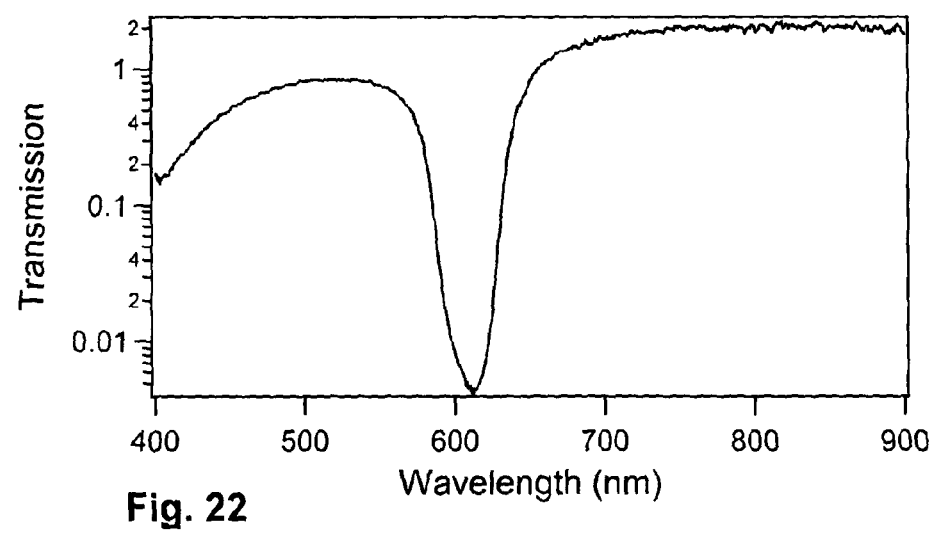
FIG. 22 shows the corresponding transmission spectrum (only for the ordered sample) for FIG. 21. Sample thickness 300 µm.

The inventors also investigated the effects of further increasing the periodicity of the particles in the composite, by using 20 seconds oscillation at 200% amplitude and 1 Hz followed by 20 seconds oscillation at 100% amplitude and 2 Hz. FIG. 21 shows a comparison between bright field intensity spectra for disordered (after step 1 of the shear sequence) and ordered (after step 3 modified as explained above). The ordering process results in a sharp intensity peak which is relatively selective in terms of wavelength. FIG. 22 shows the corresponding transmission spectrum for the ordered sample only.

Manufacture of Core-Shell Particles—Experimental Detail

Preparation of Monodisperse Core-Interlayer-Shell Polymer Beads

The beads produced here were similar to those described in US 2004/0253443.

A 10 L reactor with stirrer, condenser, argon inlet and heating mantle was heated to 75° C. and flushed with argon.
- 2.750 g sodium dodecylsulfate
- 2800.000 g demineralised water
- 36.000 g styrene
- 4.000 g butane dioldiacrylate were premixed and fed into the reactor. The stirrer was adjusted to 250 rpm. The temperature of the mixture was monitored. At 65° C., three freshly prepared solutions were subsequently added:
- 0.360 g sodium disulfite in 5 g demineralised water
- 5.180 g sodium persulfate in 20 g demineralised water
- 0.360 g sodium disulfite in 5 g demineralised water Cloudiness was observed after 10 min. After an additional 10 min, an emulsion consisting of:
- 2.300 g sodium dodecylsulfate
- 4.000 g potassium hydroxide
- 2.200 g Dowfax2A1 (Dow Chemicals)
- 900.000 g demineralised water
- 700.000 g styrene
- 70.000 g butane dioldiacrylate was fed dropwise at 10 mL/min. 30 min after the addition was finished, a freshly prepared solution of
- 0.250 g sodium persulfate in 5 g demineralised water was added. After 15 min, a second emulsion consisting of
- 0.500 g sodium dodecylsulfate
- 2.100 g Dowfax 2A1
- 320.000 g demineralised water
- 250.000 g methyl methacrylate
- 30.000 g ally) methacrylate was fed dropwise at 14 mL/min. 20 min after the addition was finished, a third emulsion consisting of
- 4.000 g sodium dodecylsulfate
- 2,000 g potassium hydroxide
- 1600.000 g demineralised water
- 1400.000 g ethylacrylate was added dropwise at 18 mL/min. The synthesis was terminated 60 min after the last addition was finished. The latex was filtered through a 100 μm sieve and added dropwise into a mixture of 17 L methanol and 100 mL of concentrated aqueous solution of sodium chloride under stirring. The polymer coagulated and formed a precipitate which settled after the stirring was terminated. The clear supernant was decanted, the precipitate was mixed with 5 L demineralised water and subsequently filtered through a 100 micron sieve. The filter cake was dried for three days at 45° C. in a convective oven.

Preparation of Monodisperse Core-Interlayer-Shell Polymer Beads with Higher $T_g$ and OH-Functionality A 10 L reactor with stirrer, condenser, argon inlet and heating mantle was heated to 75° C. and flushed with argon.
- 2.750 g sodium dodecylsulfate
- 2800.000 g demineralised water
- 36.000 g styrene
- 4.000 g butane dioldiacrylate were premixed and fed into the reactor. The stirrer was adjusted to 250 rpm. The temperature of the mixture was monitored. At 65° C., three freshly prepared solutions were subsequently added:
- 0.360 g sodium disulfite in 5 g demineralised water,
- 5.180 g sodium persulfate in 20 g demineralised water
- 0.360 g sodium disulfite in 5 g demineralised water Cloudiness was observed after 10 min. After an additional 10 min, an emulsion consisting of:
- 2.300 g sodium dodecylsulfate
- 4.000 g potassium hydroxide
- 2.200 g Dowfax2A1
- 900,000 g demineralised water
- 700.000 g styrene
- 70.000 g butane dioldiacrylate was fed dropwise at 10 mL/min. 30 min after the addition was finished, a freshly prepared solution of:
- 0.250 g sodium persulfate in 5 g demineralised water was added. After 15 min, a second emulsion consisting of:
- 0.500 g sodium dodecylsulfate
- 2.100 g Dowfax 2A1
- 320.000 g demineralised water
- 250.000 g ethylacrylate
- 30.000 g allyl methacrylate was fed dropwise at 14 mL/min. 20 min after the addition was finished, a third emulsion consisting of:
- 4.000 g sodium dodecylsulfate
- 2.000 g potassium hydroxide
- 1600.000 g demineralised water
- 404.7 g ethylacrylate
- 603.3 g isobutyl methacrylate
- 42 g hydroxyethyl methacrylate was added dropwise at 18 mL/min. The synthesis was terminated 60 min after the last addition was finished. The latex was filtered through a 100 μm sieve and added dropwise into a mixture of 17 L methanol and 100 mL of concentrated aqueous solution of sodium chloride under stirring. The polymer coagulated and formed a precipitate which settled after the stirring was terminated. The clear supernant was decanted, the precipitate was mixed with 5 L demineralised water and subsequently filtered through a 100 micron sieve. The filter cake was dried for three days at 45° C. in a convective oven.

Preparation of Polymer Compounds with Additives for the Melt-Processing 100 g of polymer was mixed with 1 g of Licolub FA1 (Clariant) and 0.05 g Special Black 4 (Evonik) at 140° C. and 100 rpm in an twin-screw DSM Xplore μ5 microextruder. The material was passed 4 times through the extruder.

Preparation of a Compound of CS330 for the Melt Processing with Photoinitiator for Additional Photocrosslinkinq 100 g of polymer was mixed with 1% Licolub FA1 (Clariant), 2% benzophenone (Sigma-Aldrich) and 0.05 g Special Black 4 (Evonik) in an twin-screw DSM Xplore µ5 microextruder at 120° C. and 100 rpm. The material was passed 4 times through the extruder.

Preparation of Opal Disks by Pressing 6 g of polymer compound was heated on a hotplate set to 150° C. The softened polymer mass was placed between two PET foils and two polished, high-gloss ironless steel sheets and pressed in a Collin press at 150° C. and 130 bar hydraulic pressure for 3 minutes.

Improvements to Processability of Composite Optical Material

The present inventors have realised that it would be advantageous for the precursor composite material to be more easily processable. Typical materials disclosed above are processed via melt-extrusion in which the temperature of the core-shell particles is increased above Tg of the shell material, typically at about 150° C. However, even at this temperature, the material is extremely viscous. It is therefore difficult to extrude films that are both thin and wide. It is possible to extrude a ribbon and subsequently roll the ribbon out to form a film, but this requires additional processing steps and may result in unwanted crinkling of the sandwiching layers and consequential non-uniformity of the optical material.

The present inventors have carried out detailed work to address this problem. Several approaches have been considered in order to improve the processability without adversely affecting the properties of the final composite optical material, which is referred to in parts of this disclosure as the polymer opal.

One approach was to extrude films of thickness less than 40 µm directly through a slit die. The intention was that subsequent rolling could then be used to induce the formation of structural colour but this rolling was not intended for reducing the film thickness. However, the melt of precursor composite material was too viscous for the extrusion of thin films through a die. An attempt was made to use plasticisers in order to reduce the melt viscosity to promote extrusion of thin films. Suitable plasticisers (at suitable addition levels) were found to reduce the viscosity of the polymer melt significantly without adversely affecting the formation of structural colour. However, the result of the use of plasticisers was that the melt and the films were very sticky. Thin, free-standing films were impossible to manufacture because the material was mechanically too weak.

The use of plasticisers in the manufacture of polymer opals is disclosed in U.S. Pat. No. 6,337,131. In the view of the inventors, this would result in the same problems as identified above.

Preferred core-shell particles for use in the present invention are as disclosed in EP-A-1425322. These particles are more properly designated as core-interlayer-shell particles, in which the polymer of the shell is grafted to the core by grafting—this is the function of the interlayer. It is therefore preferred that the shell is grafted to a significant degree. This can be obtained by an interlayer. Otherwise the grafting agent can be added to the core which means that more grafting agent has to be used, but in that case the interlayer can be omitted.

The particles typically have diameter 180-350 nm (depending on the required structural colour behaviour of the final composite optical material) and typically consist of:

Core: Polystyrene, crosslinked with 10 wt % butanediol diacrylate

Interlayer: Methylmethacrylate, crosslinked with 10 wt % allyl methacrylate which also is necessary for the grafting of the shell polymer Shell: Uncrosslinked polymer chains of poly ethyl acrylate, main fraction grafted via the interlayer with allylmethacrylate onto the core Grafting via the interlayer allows for crystallisation of the particles in the melt under shear as it prevents the shell polymer from floating off the cores. Opal films from core-shell beads without grafting are typically formed under conditions of low shear e.g. by drying from dispersions. Such techniques are much less appropriate for large scale production than the techniques disclosed here.

It is found that when pressing techniques are used to form the composite optical material, the presence of a grafting interlayer is an important component in ensuring that structural colour behaviour is obtained.

Studies on model beads with silica cores which could be removed from the shell polymer by etching with hydrofluoric acid have revealed that the typical grafting efficiency in opal polymers for the melt processing can be as high as about 70%. (Spahn, Peter "Kolloidale Kristalle aus monodispersen Silika-Polymer Hybridpartikeln" TU Darmstadt [Dissertation], (2008) http://tuprints.ulb.tu-darmstadt.de/id/eprint/1010). Determination of the molecular mass distribution of the shell polymer showed that it contains a significant fraction of branched polymer (get) with $Mw \geq 10^6$ g/mol. Such opal polymers have a very high melt viscosity due to the high fractions of cores (which do not melt in the processing), gelled and grafted shell polymer. This makes processing into thin opal films difficult. The high viscosity of the melt particularly limits the maximum width and minimum thickness of polymer opal film achievable by melt processing with typical equipment. Thus it becomes necessary to use rollers with a high line force this makes the processing apparatus complex and expensive. Furthermore, the high viscosity limits the line speed of the foil production and therefore the throughput.

As discussed above, the use of high-shear processes after film formation can significantly improve the structural colour behaviour of polymer opal films. This has been found to be the case particularly for films of thickness 100 µm or less. Such processes would significantly benefit from progress in easing the manufacture of the film from the melt.

The understanding in the field at the time of making the present invention was that grafting to the largest extent was necessary in order to promote ordering of the cores during shear processing. Thus, any contamination of the shell polymer with low molecular weight substances (and clearly therefore also any deliberate addition of low molecular weight substances) must be avoided, because such low molecular weight substances would not be grafted onto the cores.

EP-A-1425322 discloses the addition of additives including crosslinkers, in the field, it is well understood that these substances should only be used in small concentrations as they reduce the fraction of grafted material and thereby impair the formation of structural colour during shear of the melt.

Crosslinking of the opal films is known in order to achieve suitable elasticity, toughness and durability. Without crosslinking, polymer opal films tend to flow under load. Two strategies for the crosslinking of opal films had been explored: thermal crosslinking using blocked polyisocyanates and UV-cure.

Thermal crosslinking needs latent crosslinkers which are non-reactive under the conditions of polymer processing into opal films. The crosslinkers are activated by heat after the formation of the opal film and the generation of the structural colour is finished. Using heat for the crosslinking carries with it the danger of losing colour brilliance by diffusion or relaxation of the cores forming the crystalline lattice.

Crosslinking by UV irradiation is gentler because it can be achieved at ambient temperature. Unfortunately the shell polymer of the particles, which is typically synthesized by free-radical polymerisation in emulsion, does not have acrylic or methacrylic moieties left which could be used for efficient UV curing. Without such reactive groups, UV cure is slow and inefficient. In an example conducted for reference, benzophenone was used as a photoinitiator to induce crosslinking via H-abstraction from the polymer chains and subsequent polymer radical recombination (Benjamin Viel "Vernetzte Kunstopalfolien aus Latices, Diplomica Verlag Hamburg 2003). An irradiation of 20 min with an Osram Vitalux lamp was applied. This, however, achieved only a moderate increase in mechanical strength.

Thus, this type of UV curing approach requires uneconomically long irradiation times and yet still leads to insufficient curing and unsatisfying mechanical durability. Furthermore, the surface of the polymer opal films remains sticky. The addition of reactive monomers capable of crosslinking under UV irradiation has not been attempted in the past because firstly the monomers were considered disadvantageous for the formation of structural colour (because they are not grafted to the cores) and secondly it was considered that such monomers would not react with the shell polymer significantly to improve the mechanical properties of the polymer opal films.

Surprisingly it has now been found that the addition of some lower molecular mass materials can improve processability without impairing the formation of the structural colour under shear. Particularly advantageous is the addition of monomers and reactants capable of UV cure for subsequent crosslinking.

Two approaches have been investigated. The first can be considered to be temporary modification of the material by the addition of a volatile solvent. The second can be considered to be permanent modification, by the addition of low volatile solvents, monomers or other reactants which are liquid under the processing conditions, or by reducing the molar mass of the shell polymer.

The first approach allows a stepwise process where the formation of the polymer opal film, supported by the solvent, can be done in a processing step which establishes the shape of the body of composite precursor material. The solvent can then be removed by easy evaporation. The development of the structural colour by shear can then be made in a subsequent step, thereby avoiding any potential negative influence of the solvent. This approach allows use of any solvents in any concentration without the risk of impairing the development of structural colour under shear. It gives the freedom to produce very thin polymer opal films even with low-force equipment.

The second approach uses permanent modifications which remain present during the shear processing. Therefore more attention for a proper choice of the additives is necessary to ensure that the development of the structural colour by shear is not impaired. It has been confirmed that it is possible to improve the flowability of the opal polymer melt without impairing the development of structural colour by several different techniques.

In some embodiments of this second approach, the molecular weight of the shell polymer can be reduced during the synthesis using chain transfer agents.

In other embodiments of this second approach, non-grafted shell polymer can be added, preferably shell polymer of low molecular mass. This can be added to the melt. This is significant because it was previously considered that full grafting of the shell polymer was of high importance.

In other embodiments of this second approach, low-molecular liquids such as low volatile solvents, plasticisers, monomers or other reactants can be added into the melt.

Improvement of the flowability has been found by addition of additives, in the form of plasticisers (high boiling solvents) and polyethylacrylate (lower molecular weight, ungrafted shell polymer). The UVvis spectra of pressed opal disks using various additives showed that the generation of structural colour was not impaired by the addition of the additives.

It was found that when the precursor composite material is formed with core-shell particles using a poly ethylacrylate shell polymer of reduced molar mass (synthesised in emulsion by addition of a thiol as a chain transfer agent), the resultant material was extremely soft and sticky, and therefore not of use for free-standing films. Pressed opal disks showed strong structural colour. However, this colour was not persistent and disappeared during storage of the disks.

It is therefore preferred to use reactive additives, since these could avoid the drawback identified above. After curing, such additives become a chemically bonded permanent constituent of the opal films. Another significant advantage is that the emission of VOC and the migration of substances of low molecular mass is reduced or avoided altogether, which helps to meet regulatory requirements concerning environmental protection and consumer protection.

Latent reactive additives are preferred. They are "latent" in the sense that they are non-reactive during the polymer processing into polymer opal films but activated by stimuli after the formation of the films and the generation of structural colour are finished. Suitable stimuli are heat, radiation, pressure, humidity, etc. UV radiation is most preferred as it allows clean processes with low emissions and it requires only low investment. Furthermore, many proven monomers, reactants and additives are commercially available allowing wide adjustment of the properties of the cured product.

Surprisingly it has been found that using monomers to improve processability of the opal polymers and subsequent UV cure based on a free radical polymerisation of a (meth)acrylate containing composition is particularly advantageous. Compared to UV cure of the opal polymer without added monomers, the curing reaction proceeds much more rapidly and a higher mechanical strength of the polymer opal films is easily obtained. Also, a significant reduction of the surface stickiness is observed allowing easy removal of the protective (PET) foil.

Polymers based on (meth)acrylates are known as an additive for UV-curable lacquers (e.g. Degalan available from Evonik Röhm GmbH). We note that there is no apparent discussion in the literature available from the supplier in relation to chemical reaction between polymer and the monomers.

UV curing is an established industrial technique for curing of coatings, prints, adhesives, dental cements and other materials. A wealth of monomers and reactants known to the person skilled in the art is commercially available.

Several chemical approaches for the UV cure are well known, the most established being free radical polymerisation and cationic cure. Furthermore, some special reactions like UV-initiated [2+2] cycloaddition have been published.

UV cure using free radical polymerisation is mostly based on reactants bearing ethylenically unsaturated moieties. Any monomer or oligomer capable of free radical polymerization may be used. Preferred are monomers or oligomers (or mixtures thereof) with vinylic, acrylic or methacrylic groups. Polymerisable mixtures of monomers or oligomers with different degrees of functionality (mono-, di-, tri- and higher) may be used. The mixture may comprise multi-functional monomers or multi-functional oligomers with the same degree of functionality. Examples for suitable monomers and oligomers are listed, for example, in EP-A-1911814 A, U.S. Pat. No. 6,310,115, EP-A-2305762. Still further examples are described in the academic literature e.g. R. Schwalm "UV Coatings" Elsevier B. V. 2007, ISBN-10: 0-444-52979-9; R. S. Davidson "Report 136: Radiation Curing" in RAPRA Review Reports, Volume 12, No 4, 2001, RAPRA technology Ltd ISSN: 0889-3144. Another source of information are the product lists and brochures of suppliers specialising in monomers and oligomers for UV-curable formulations e.g. Sartomer (now part of Arkema).

The curing reaction is initiated by radicals generated from light sensitive initiators ("photoinitiators") either by decomposition (Norrish-type I) or H-abstraction (Norrish-type II). Examples for Norrish-type I photoinitiators are derivatives of benzoin ethers, benzyl ketales or alkoxyacetophenones. Examples for Norrish-type II photoinitiators are derivatives of benzophenone and isothioxanthone. Other suitable photoinitiators are described in the patents and literature mentioned above and in the product brochures of specialised suppliers e.g. BASF SE (also offering the former products of CIBA), Lamberti and Spectra Group Ltd Inc.

The curing proceeds by the polymerisation of the unsaturated moieties after the initiation by the radicals. The reaction is sensitive to oxygen. The protective foil, which is present in the case that the structural colour is to be developed by the shear processing techniques described above and below, is particularly advantageous for UV cure by the free-radical polymerisation because it keeps the oxygen away.

Additional additives may be are combined with the monomers and the photoinitiators. Sensitizers which allow using longer-wavelength radiation for the activation of the photoinitiators are particularly advantageous for the curing of pigmented systems. Even curing with visible light can often be achieved by a proper combination of photoinitiators and sensitizers. Co-initiators, often amines, are used to increase curing speed and reduce surface tackiness. They are also advantageous as a hydrogen source for the Norrish-type II photoinitiators.

Cationic cure typically based on reactants bearing epoxy-groups which can polymerise by ring-opening-polymerisation. Various co-reactants like oxethanes, carbonates or polyalcohols can be co-polymerised. This advantage could be used to chemically bond the opal polymer to the polymer chains growing during the cationic cure. Suitable moieties can easily be incorporated into the polymer chains of the opal polymer as already shown for hydroxylic groups.

Typically cationic UV curing is initiated by cations originating from a photosensitive sulfonium- or iodonium salt ("photoinitiator"). Additional additives (e.g. sensitizers) may be used to increase the curing speed or curing efficiency at longer wavelength. Special reactions such as photoinitiated [2+2] cycloaddition based on coumarines or maleimides may offer the possibility of reversible curing.

For the choice of monomers and reactants, their impact on safety and processability should be considered. Advantageous properties are
- low volatility to enable compounding and processing of the opal polymers at elevated temperatures;
- low toxicity (most monomers are at least irritant to skin, eyes and the respiratory system);
- good miscibility with the opal polymer;
- significant decrease of the viscosity of the opal polymer thereby improving the process ability and the generation of structural colour by shear;
- high reactivity for short irradiation and curing times;
- good commercial availability and low price.

Furthermore the impact on the properties of the cured opal films has to be considered. Mechanical properties, chemical resistance, durability, adhesion on foil and other properties are influenced both by the monomers and reactants used for the UV cure and the kind of opal polymer. To achieve a desired combination of properties both the choice of monomers and reactants of the UV cure and the composition of the opal polymer should be optimized.

Materials Used in Examples

Several combinations of opal polymers with UV curing monomers (free radical polymerisation) have been tested. The composition of the particles was:

| | | |
|---|---|---|
| 32.5 wt % | Core | poly styrene, crosslinked with 10% butane diol diacrylate |
| 11 wt % | Interlayer | poly ethylacrylate crosslinked with 10% of allyl methacrylate |
| 56.5 wt % | Shell | copolymer of 72 wt % ethylacrylate, 25 wt % i-butyl methacrylate, 3 wt % hydroxyethylmethacrylate |

The temperature of the glass transition of the shell polymer forming the matrix of the opal films was determined by DCS Tg=0-4° C.

Acrylic, bifunctional:
1,4 Butanediol diacrylate

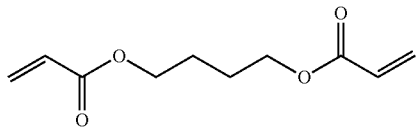

CAS 1070-70-8
Hazard code: Corrosive (C);
Harmful in contact with skin, Causes burns, May cause sensitization by skin contact
Boiling point 83° C./0.3 mmHg (lit.)
Methacrylic, bifunctional:
1,4 Butanediol dimethacrylate

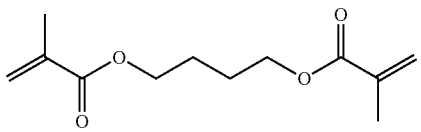 [SMILES: C=C(C)C(=O)OCCCCOC(=O)C(=C)C]

CAS 2082-81-7
Hazard code: Irritant (Xi);

Irritating to eyes, respiratory system and skin, May cause sensitization by skin contact
Boiling point 132-134° C./4 mmHg (lit.)
Ethylenglycol Dimethacrylate

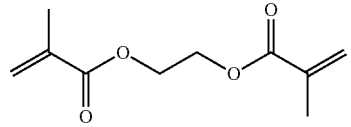

CAS 97-90-5
Hazard code: Irritant (Xi)
Irritating to the respiratory system, May cause sensitization by skin contact
Boiling point 98-100° C./5 mmHg (lit.)
Allylic, bifunctional:
Diallyl Phthalate

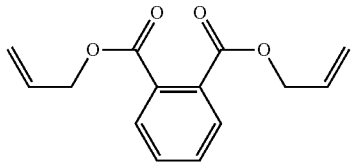 [SMILES: C=CCOC(=O)c1ccccc1C(=O)OCC=C]

CAS 131-17-9
Hazard code: Harmful Xn, N
Harmful if swallowed, Very Toxic to aquatic organisms, may cause long-term adverse effects in the aquatic environment
Boiling point 158° C.
Other suitable monomers are:
Isobornyl acrylate CAS 5888-33-5
Isobornyl methacrylate CAS 7534-94-3
Sartomer SR256 2(2-Ethoxyethoxy) ethylacrylate CAS 7328-17-8
Sartomer SR259 (Polyethyleneglycol (200)) diacrylate CAS 26570-48-9
Sartomer SR454 ethoxylated (3 mol) trimethylolpropane triacrylate
Sartomer SR 210 (Polyethylene glycol (200)) dimethacrylate CAS 25852-47-5
Sartomer SR 252 (Polyethylene glycol (600)) dimethacrylate CAS 25852-47-5
Glycerol propoxylate triacrylate CAS 52408-84-1
Tripropylene glycol diacrylate CAS 42978-66-5
Monomers having the isobornyl group yield a very low viscosity of the melt. The (polyglycol)-based monomers are very low volatile and nearly odourless.
These commercially available photoinitiators were used:
Norrish Type II:
Benzophenone
CAS 119-61-9
Hazard code: Irritant (Xi); N
Irritating to eyes, respiratory system and skin, May cause sensitization by skin contact; Very toxic to aquatic organisms, may cause long-term adverse effects in the aquatic environment
Boiling point 305° C., Melting Point 49° C.
Norrish Type I:
Darocure 1173 (Ciba, now part of BASF SE)

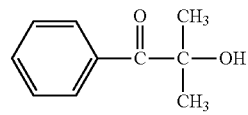

2-Hydroxy-2-methyl-1-phenyl-1-propanon
CAS 7473-98-5
Hazard code: Harmful (Xn)
Harmful if swallowed
Boiling point 102-103° C./4 mmHg (lit)
Irgacure 819 (Ciba, now part of BASF SE)

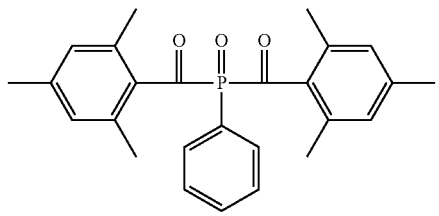

Bis(2,4,6-trimethylbenzoyl)-phenylphosphineoxide
CAS 162881-26-7
Hazard code: Irritant (Xi)
May cause sensitization by skin contact; May cause long-term adverse effects in the aquatic environment
Melting Point 131-135° C.
Irgacure 184 (Ciba, now part of BASF SE)

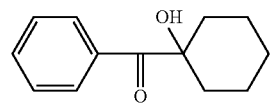 [SMILES: O=C(c1ccccc1)C1(O)CCCCC1]

1-Hydroxycyclohexyl phenyl ketone
CAS 947-19-3
Hazard code: Irritant (Xi)
Irritating to the eyes
Melting Point 45-49° C.
Compounding and Extrusion of Examples
In the following, "phr" refers to parts per hundred resin. Thus, as an example, for addition of component B to resin A, 15 parts B added to 100 parts A would represent 15 phr B.
The photoinitiators, 1 phr wax Licolub FA1, 0.05 phr carbon black Special Black 4 and the monomers were mixed into the melt of the opal polymer with a lab microextruder µ5, DSM Xplore, operated at 90° C. The extruded strands were collected, mixed and extruded again. In total three passes were used to achieve homogeneous mixing. Mixtures with 10% or more monomer were very sticky and paste-like. The temperature of the extruder was adjusted due to the decrease in melt viscosity with increasing concentration of monomers. Table 4 below gives an overview. The lower process temperatures are indicative of the improved flowability.

TABLE 4

Processing temperature of the microextruder for the compounding of the opal polymers with monomers:

| Addition of monomer/phr | Processing temperature |
|---|---|
| 0 | 120° C. |
| 5 | 90° C. |
| 10 | 65-70° C. |
| 15 | 50-60° C. |
| 30 | RT-40° C. |

Melt Flow Rate Measurement of Examples

The flowability of the melt was measured with melt indexer Schmelzindex Prüfgerät MI-2, Göttfert. This instrument measures the flow of a polymer melt under pressure through a die. The measurement is in step with the practical process where the opal polymer is pressed through a slit die forming the film. Due to the stickiness of the mixtures with monomers, no reliable number for the melt flow rate was obtained. Instead of approaching a constant value, the flow rate increased until the reservoir of the instrument was empty. Nevertheless significant differences in flow rates of polymer with different concentrations of monomer could be easily be distinguished. The measurements were made at 90° C. under a load of 21.6 kg and with a die of geometry L/D=8 mm/2.095 mm, Forming Opal Disks of Examples Opal films were pressed with a Dr Collins hydraulic press. 5 g of opal polymer or the mixtures with monomers were placed between sheets of protective foil (PET Mylar A 75, DuPont) and high-gloss steel plates. After warming to 90° C., the press was closed with a hydraulic pressure of 150 bar and kept closed for 3 min.

UV Cure of Examples

Instead of the Osram Ultra Vitalux 300 lamp (artificial sunlight) mentioned above, which emits low UV but much heat, an industrial-type mercury lamp in cold mirror configuration, UV Cube 2000 was used. The radiation source is a common type for UV cure of coatings, The output power of the UV Cube can be switched between 100 W/cm and 200 W/cm. The arc length of the mercury lamp was 10 cm. The PET-covered opal disks were irradiated at a distance of 4 cm. The warming during irradiation was moderate. The opal disks became warm to the touch after 3 min of irradiation with 200 W/cm.

Tensile Testing of Examples

Test specimens were stamped out from the cured opal films sandwiched by the PET foils. After subsequent removal of the PET foils, tensile testing was carried out with a tensile tester zwickiline, Zwick GmbH, at a speed of 1 mm/min at ambient temperature.

Melt Flow Rate Results

Figure 23:
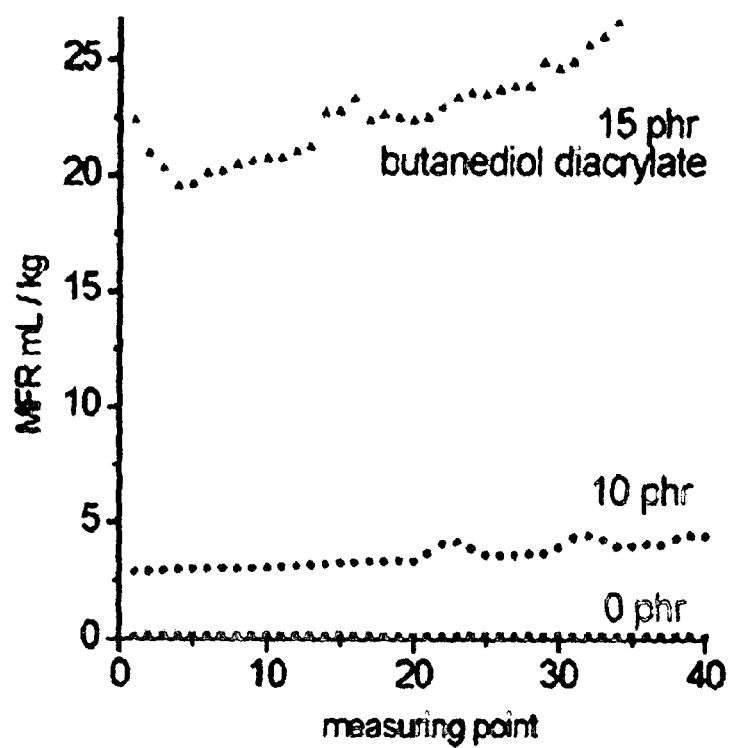
FIG. 23 shows the melt flow rate for mixtures of opal polymer with different additions of butanediol diacrylate at a temperature of 90° C. The variation in flow rate with time resulted in the plot of MFR with respect to measuring point (i.e. time). The conditions of MFR testing were L/D 8 mm/2.095 mm, weight 21.6 kg.

FIG. 23 shows the flow rate for mixtures of opal polymer with different additions of butanediol diacrylate at a temperature of 90° C. The flowability was enormously improved by the addition of the monomer. The opal polymer without any monomer had an extremely low melt flow rate (MFR) of about 0.1 mL/min. Such a low MFR is common for very high viscous, high molecular weight polymer used only for extrusion. 10% of monomer increased the MFR to 3-4 mL/min which is typical for industrial polymers used in many processes, including injection moulding. The MFR of the mixture with 15% of monomer is on average as high as 22 mL/min, similar to the behaviour of very low viscous commercial polymers. This result is very significant: The opal polymer can be tuned by the addition of up to 10% of monomer matching the range of viscosities of standard polymers for common industrial processes.

Mechanical Properties Results

Figure 24:
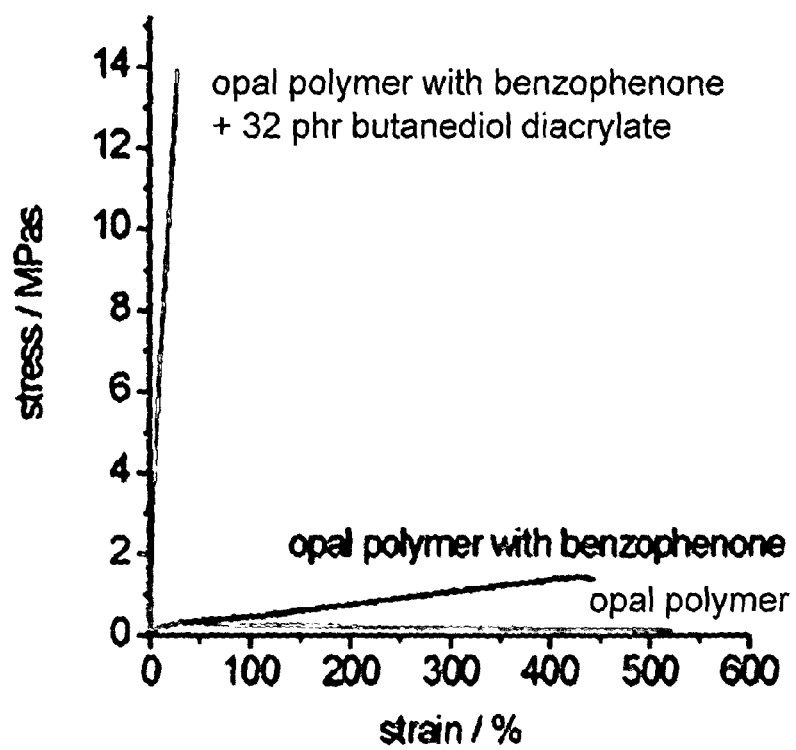
FIGS. 24 and 25 illustrate the impact of the monomer concentration on the mechanical properties of pressed opal polymer disks after UV cure via tensile testing.
Figure 25:
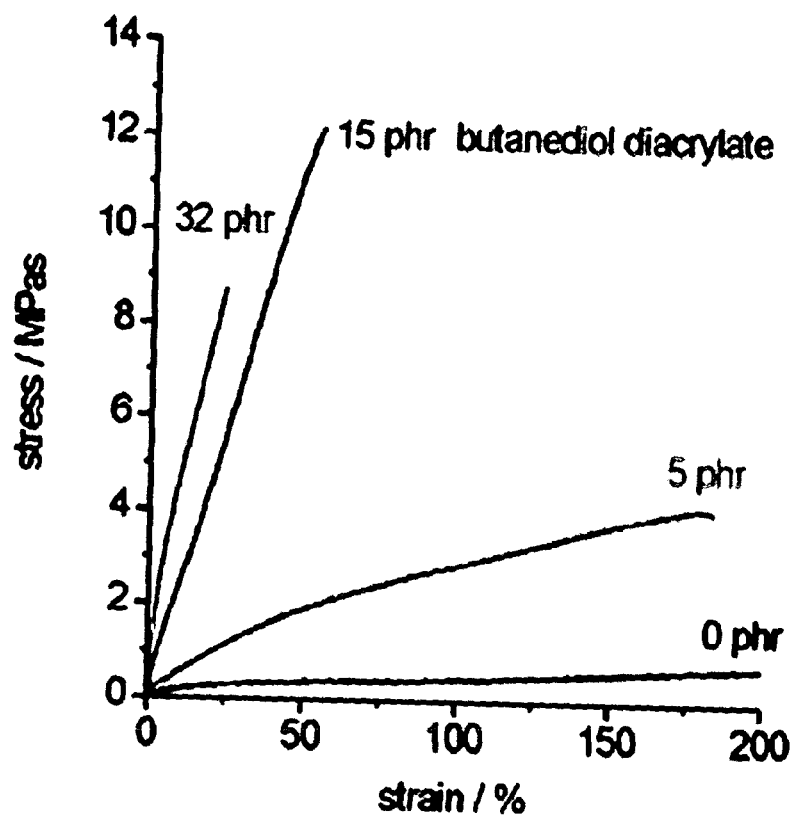

FIGS. 24 and 25 illustrate the impact of the monomer concentration on the mechanical properties of pressed opal polymer disks after UV cure via tensile testing. The results show the enormous increase in mechanical strength by UV cure with butanediol diacrylate added. Similar results are obtained both with the Osram Vitalux (FIG. 24—20 mins irradiation) and the UVCube (FIG. 25—100 W/cm$^2$ 2×3 mins irradiation) as sources of radiation but different irradiation times.

Impact of the Monomer Type on the Mechanical Properties

From the monomers tested butanediol diacrylate, butanediol dimethacrylate, ethylenglycol dimethacrylate and diallyl phthalate the first two were the most promising. The ethylenglycol dimethacrylate polymerised during feeding into the melt at 60° C. With butanediol diacrylate and butanediol dimethacrylate no such premature polymerisation in the melt occurred although the UV cure of the pressed films was surprisingly fast. Even with 32 phr of diallylphthalate, no cure of the sticky polymer mixture was observed even after prolonged irradiation with the UVCube.

Although diallylphthalate and ethylenglycol dimethacrylate are not ideally suited to the particular processing conditions described here, this does not signify that these particular monomer cannot be used in the methods of the invention. These monomers may find used under in other methods, under different process conditions, optionally with other particles.

Figure 26:
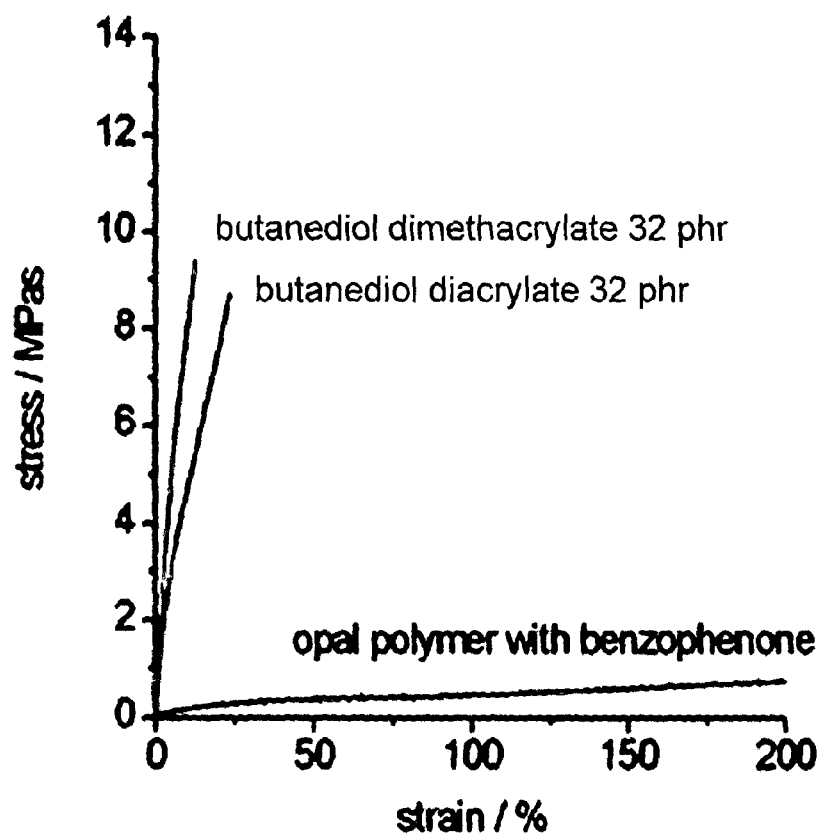
FIG. 26 shows a comparison of tensile tests of opal polymers with butanediol diacrylate and butanediol dimethacrylate.

FIG. 26 shows a comparison of tensile tests of pressed opal polymer disks with butanediol diacrylate and butanediol dimethacrylate, each sample containing 2 phr benzophenone as photoinitiator. The UV cure was with the UVCube (100 W/cm$^2$ 2×2 mins). As expected, butanediol dimethacrylate hardens the opal polymer even more than the acrylate. Because of the better elasticity, butanediol diacrylate (BDDA) was made standard for further investigations.

Comparison of Different Photoinitiators

Figure 27:
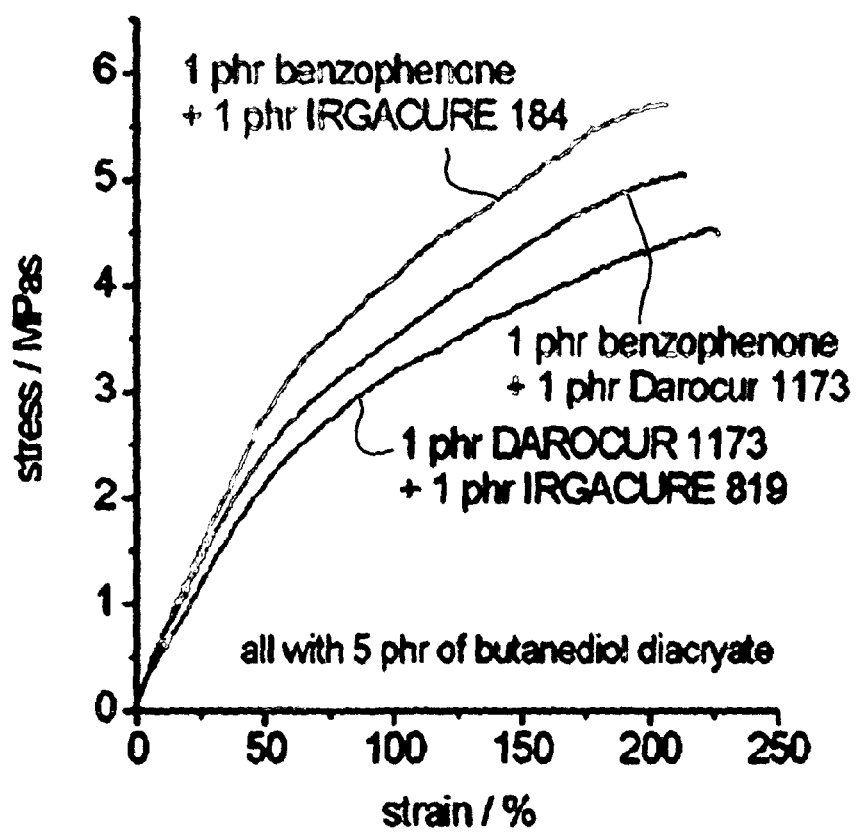
FIG. 27 shows the results for tensile tests of opal polymers with 5 phr of butanediol diacrylate and different mixtures of photoinitiators.

FIG. 27 shows the results for tensile tests of opal polymers with 5 phr of butanediol diacrylate and different mixtures of photoinitiators. The cure was with the UVCube (100 W/cm$^2$ 2×15 secs). Benzophenone, which was used for the UV cure of opal films without added monomers, has the disadvantage of unsatisfactory miscibility. In concentrations exceeding 2 wt %, benzophenone tends to separate from the opal polymer. Therefore other photoinitiators of better miscibility were added. Three combinations of less reactive photoinitiators, with broader and longer wavelength absorption for through-cure, and reactive photoinitiators, with absorption at lower wavelengths for surface cure, were identified for further testing. The results are shown in FIG. 27. The pressed opal disks were irradiated for only 15 s on both sides. The mixture of benzophenone and Irgacure 184 is slightly more active than the other mixtures. As also the volatility and temperature resistance of Irgacure 184 is very low compared to Darocur 1173, this mixture seems to be the most appropriate for large scale production. The liquid Darocur 1173 was preferred in combination with the low-melting benzophenone for the small scale investigations because it is easier to feed into the microextruder.

Impact of Irradiation Time

Figure 28:
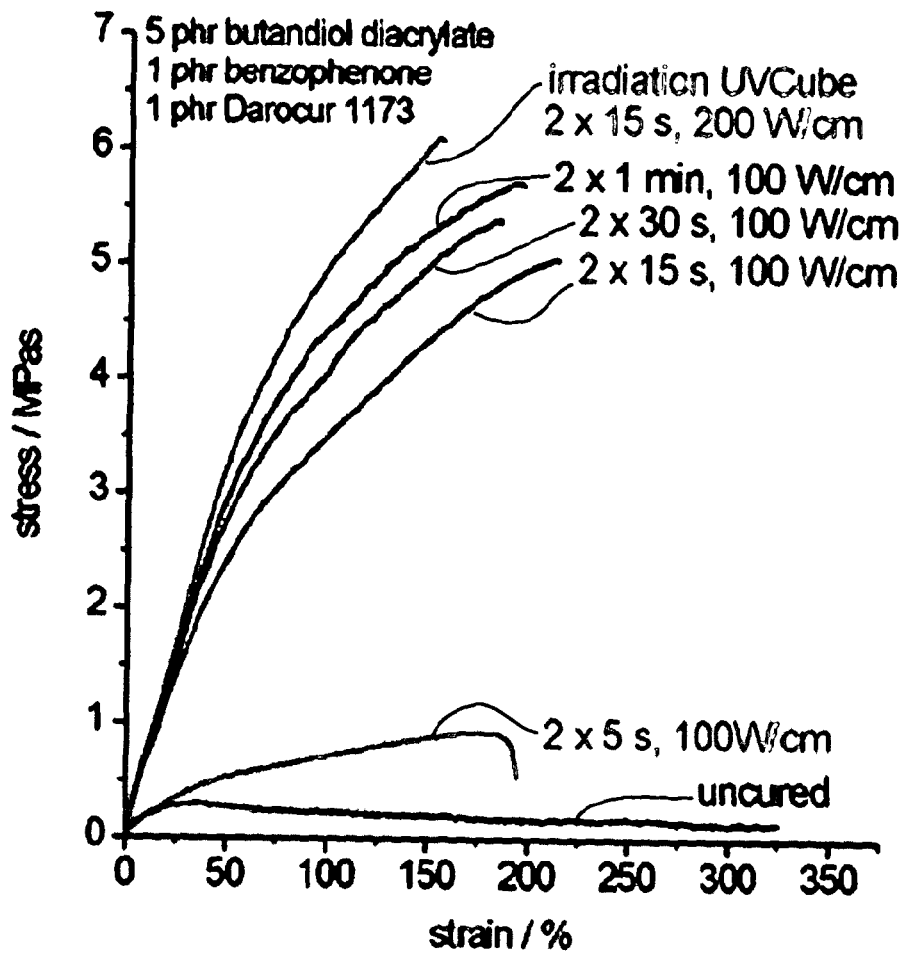
FIG. 28 shows tensile test results for opal polymers with 5 phr of butanediol diacrylate, 1 phr benzophenone and 1 phr Darocur 1173 cured under different conditions of UV irradiation.

FIG. 28 shows tensile test results for opal polymers with 5 phr of butanediol diacrylate, 1 phr benzophenone and 1 phr Darocur 1173 cured under different conditions of UV irradiation. A significant increase in mechanical strength indicative for the degree of cure is observed with an irradiation time of at least 15 s on both sides of the opal film. The difference between opal disks irradiated for only 15 s and longer times, up to 2 min on each side, is less pronounced.

Impact of Film Thickness

Figure 29:
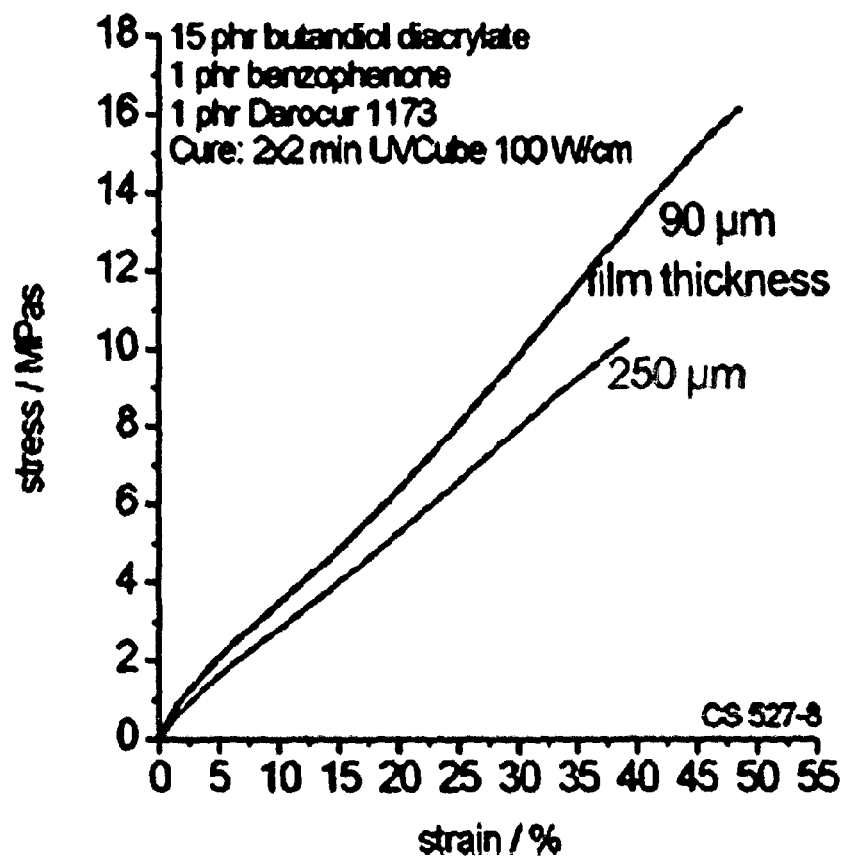
FIG. 29 compares tensile tests of specimens taken from areas of different thickness for a composition of 15 phr BDDA, 1 phr benzophenone, 1 phr Darocur 1173 (cure UVCube 100 W/cm 2×2 mins).

The thickness of pressed opal disks is typically higher in the central area and lower towards the edges. FIG. 29 compares tensile tests of specimens taken from areas of different thickness for a composition of 15 phr BDDA, 1 phr benzophenone, 1 phr Darocur 1173 (cure UVCube 100 W/cm 2×2 mins). The results confirm that UV cure is particularly advantageous for thinner films. The UV radiation is absorbed passing through the film. The exponential decrease of the radiation intensity with film depth makes the through-cure of thick films difficult. As expected, the thicker film shows slightly lower mechanical strength indicating weaker cure as the fraction of less cured material in the depth of the film is larger.

Impact of the Concentration of Carbon Black

Figure 30:
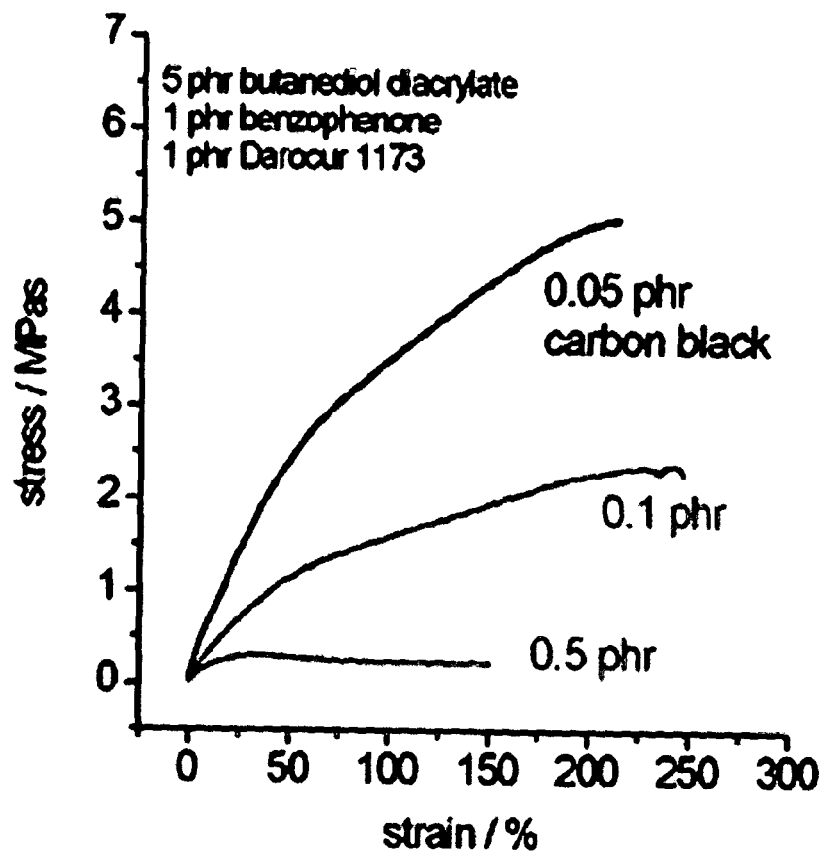
FIGS. 30 and 31 show tensile test results for polymer opal films with different concentrations of carbon black and different UV cures (FIG. 30: UVCube 100 W/cm, 2×15 s irradiation time.
Figure 31:
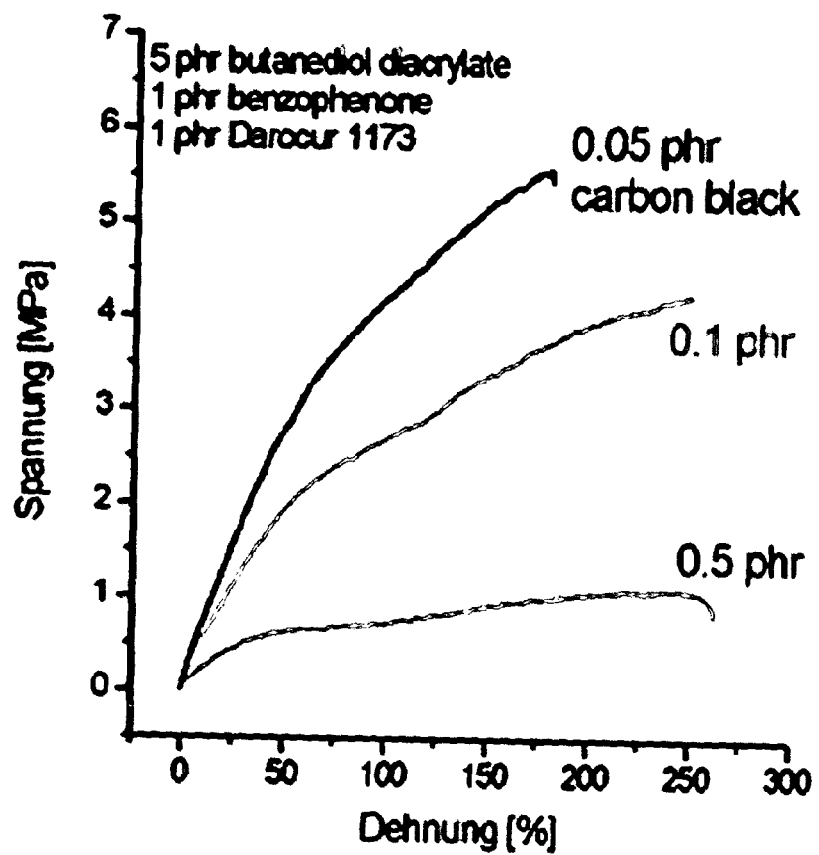

Carbon black is detrimental to the UV cure as it strongly absorbs the radiation needed for the activation of the photoinitiator. Unsurprisingly the mechanical strength, which is indicative of the degree of cure, is best for the sample with the lowest concentration of carbon black. This is shown in FIGS. 30 and 31. It is clear to see that every increase in carbon black concentration directly lowers the degree of cure for given conditions of irradiation. Doubling the irradiation time from 2×15 s (FIG. 30) to 2×30 s (FIG. 31) cannot compensate for the decrease in crosslinking efficiency caused by doubling the concentration of carbon black. The composition used in FIGS. 30 and 31 is 5 phr BDDA, 1 phr benzophenone, 1 phr Darocur 1173 and various concentrations of carbon black (Special Black 4).

Storage Stability of Opal Polymer with Added Monomer

Figure 32:
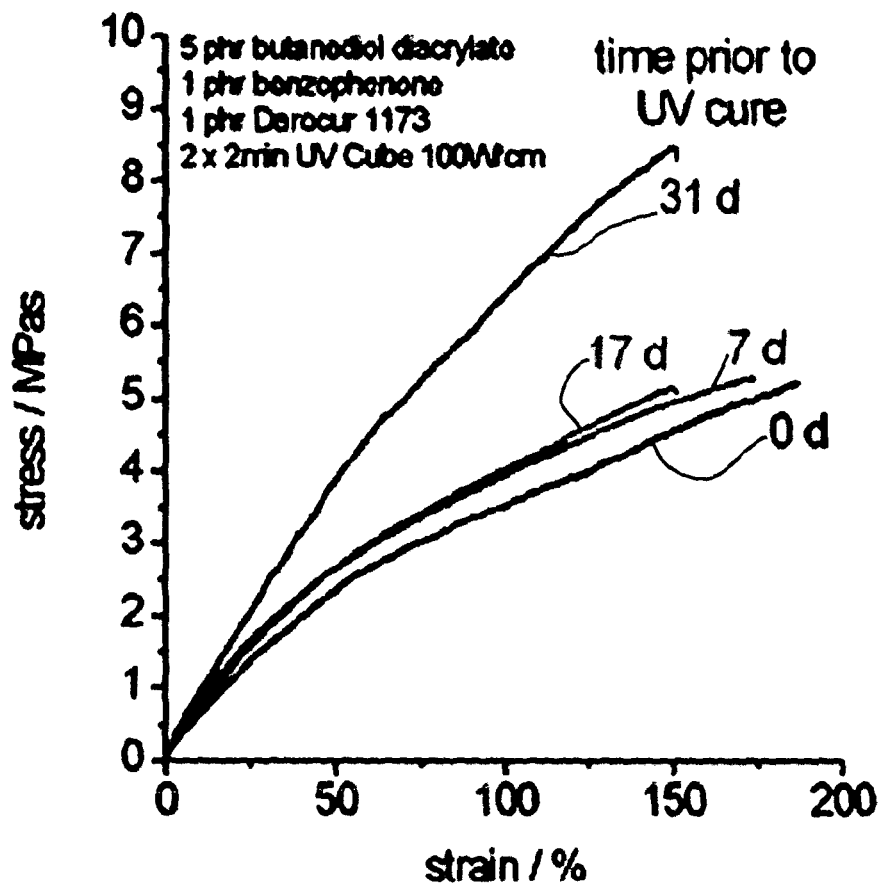
FIG. 32 shows the results of tensile tests of mixtures of UV cured opal polymer with 5 phr of butanediol diacrylate, 1 phr of benzophenone and 1 phr of Darocur 1173 which were stored prior to the pressing of the opal disks and the UV cure.

FIG. 32 shows the results of tensile tests of mixtures of UV cured opal polymer with 5 phr of butanediol diacrylate, 1 phr of benzophenone and 1 phr of Darocur 1173 which were stored prior to the pressing of the opal disks and the UV cure. The UV cure was 2×2 mins using the UVCube at 100 W/cm. These results show that there is an increase in mechanical strength the longer the mixtures were stored. The reason of the change is unknown at the time of writing. Despite the increase in hardness pressing of the opal polymer and generation of structural colour was not impaired. This observation is important, as it indicates the possibility of preparing mixtures of opal polymer with monomers and photoinitiator in advance of the production of the films.

Impact of the Monomers on the Development of Structural Colour

Pressed opal disks show strong structural colour after UV cure even with 32 phr monomer added.

As the monomer adds to the volume of the matrix of the opal films, the lattice of the colloidal crystal is expanded which leads to a red-shift of the structural colour. The red-shift depends directly on the amount of monomer added. This effect is well understood. The brilliance of the structural colour depends on the order of the colloidal crystal and on the strength of the scattering of the cores. It had been observed earlier and was recently confirmed that an optimum of the volume fraction of the cores exists. So far the monomers have been added without considering the impact on volume fraction of the cores. Therefore it is advantageous to change the core shell ratio of the opal polymer beads accounting for the monomer added later (for its improvement of the processability). Of particular interest is the potential impact of the monomer addition on the maximum processing speed for generating the structural colour with the shear techniques described above and below. Since the viscosity of the opal polymer is enormously reduced by the monomer addition, the ordering of the cores can occur at lower forces and with fewer shear repetitions than without the monomer.

The reduction in viscosity of the composite precursor material allows for forming processes other than extrusion and/or rolling to be considered. For example, suitable films may be formed by printing processes, or other film forming processes such as roller coating, bar coating, doctor blading, etc. Using a composite precursor material with an additional 32 phr BDDA provides a material which is very viscous at room temperature, but formable via bar coating into a 40 µm film in which structural colour could be developed. Subsequently UV irradiation allowed the strength of the film to be increased, forming a self-supporting film.

Improvements to Ordering of Composite Optical Material

During the shearing of the precursor composite material, the ordering of the core particles gradually improves. It is typical in polymer opal materials for the core particles to self-arrange into a close packed arrangement. Typically this is an fcc arrangement. A close packed plane (a {111} plane for an fcc arrangement) is typically formed parallel to the sandwiching layers. Furthermore, the direction of shear (i.e. the direction along which the first and second sandwiching layers are displaced relative to each other) typically corresponds to a close packed direction (a <110> direction for an fcc arrangement) in the close packed arrangement.

When the direction of shear is substantially the same from shear cycle to shear cycle for the entire ordering process, there is a risk of development and growth of crystal defects and/or structural defects in the periodic arrangement of core particles. Without wishing to be bound by theory, these are thought to be due to the consistent shear direction allowing minor crystalline defects (e.g. dislocations) to grow and/or accumulate with the result that the final product may include an observable optical defect. Furthermore, it is found that using a consistent shear direction results in a requirement for a relatively large number of shear cycles in order to develop a suitably periodic arrangement to exhibit high quality structural colour effects.

In a preferred embodiment of the invention, the shear ordering of the precursor composition material is altered from one shear cycle to another. This improves the ordering of the core particles and reduces of the size and/or number of observable defects in the resultant composite optical material.

Figure 33:
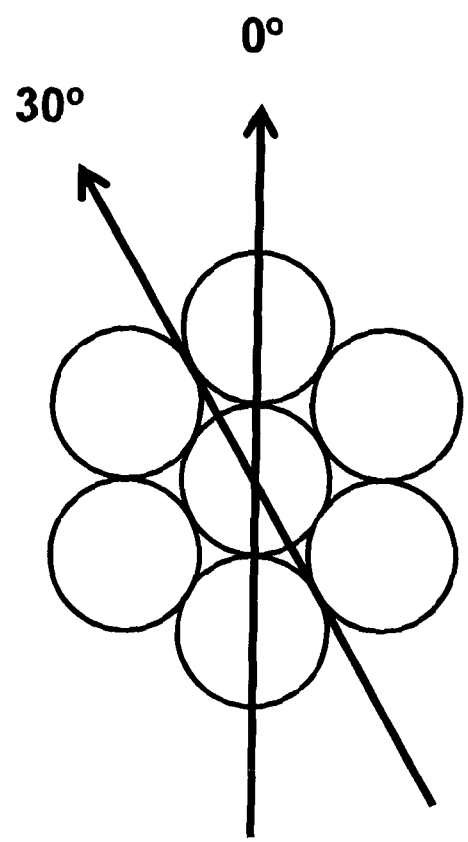
FIG. 33 provides a schematic illustration of a small portion of a {111} close packed plane in an fcc lattice.

FIG. 33 provides a schematic illustration of a small portion of a {111} close packed plane in an fcc lattice. A close packed direction (a <110> type direction) is indicated in the drawing at 0°. Angularly offset from this close packed direction is a direction at 30°. This direction is itself not a close packed direction, but instead bisects two close packed directions (which are angularly offset from each other by 60° in the (111) plane).

Figure 34:
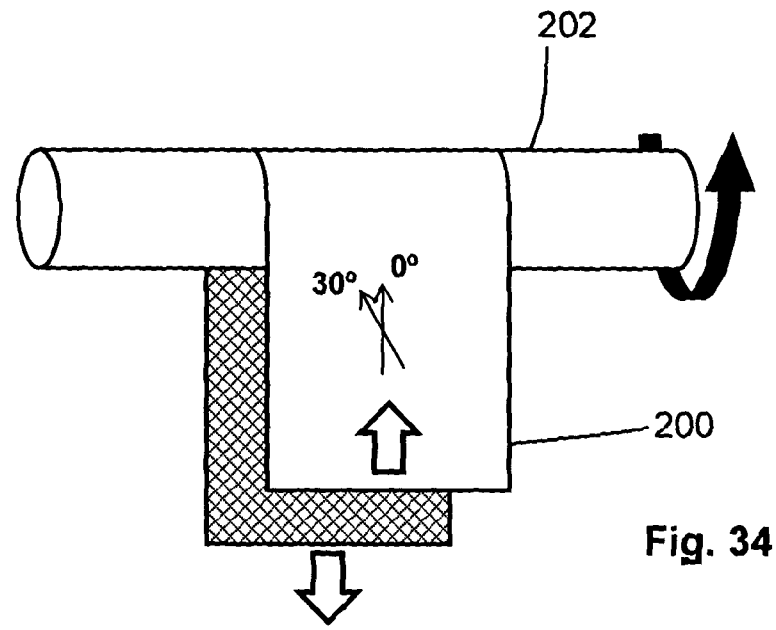
FIG. 34 schematically illustrates a curling step in which the precursor composite material is subjected to a shear direction corresponding to the 0° direction shown in FIG. 33.
Figure 35:
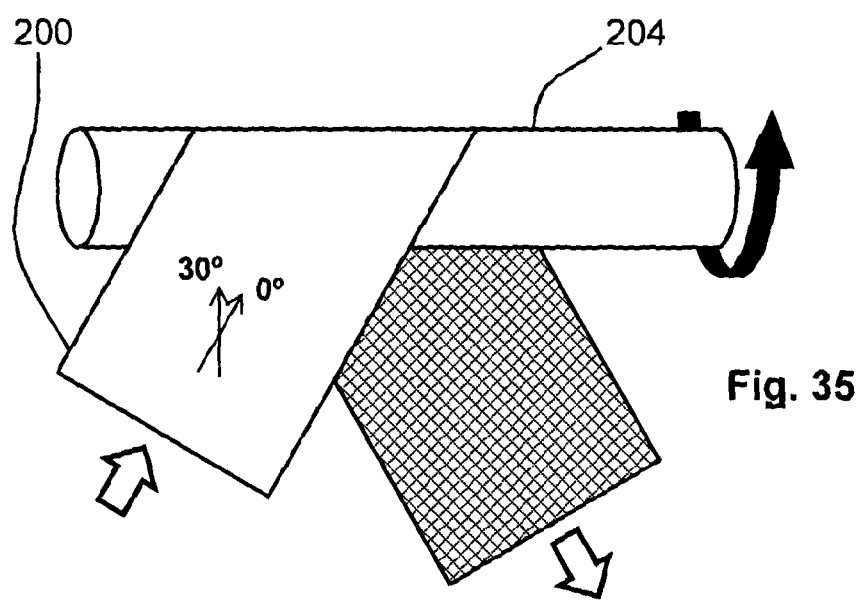
FIG. 35 schematically illustrates a subsequent curling step in which the precursor composite material is subjected to a shear direction corresponding to the 30° direction shown in FIG. 33.

FIG. 34 schematically illustrates a curling step in which the precursor composite material is subjected to a shear direction corresponding to the 0° direction shown in FIG. 33. FIG. 35 schematically illustrates a subsequent curling step in which the precursor composite material is subjected to a shear direction corresponding to the 30° direction shown in FIG. 33.

In FIG. 34, precursor composite material 200 is held between first and second sandwiching layers (not shown) formed of PET. The material is passed around roller 202 which is rotated at a speed corresponding to the speed of the material 200 in order to minimise frictional interaction between the material 200 and the roller 202. The material 200 is curled around the roller so that the resultant shear direction is parallel to the edges of the material 200.

In the subsequent rolling step shown in FIG. 35, the same precursor composite material 200 is passed around roller 204 which is rotated at a speed corresponding to the speed of the material 200 in order to minimise frictional interaction between the material 200 and the roller 204. In contrast to the curling step shown in FIG. 34, the material 200 is curled around roller 204 so that the resultant shear direction is not parallel to the edges of the material 200, but instead is offset from the shear direction used in FIG. 34 by 30°.

The material 200 may be passed forwards and backwards around the rollers 202, 204 several times in order to promote ordering.

Figure 36:
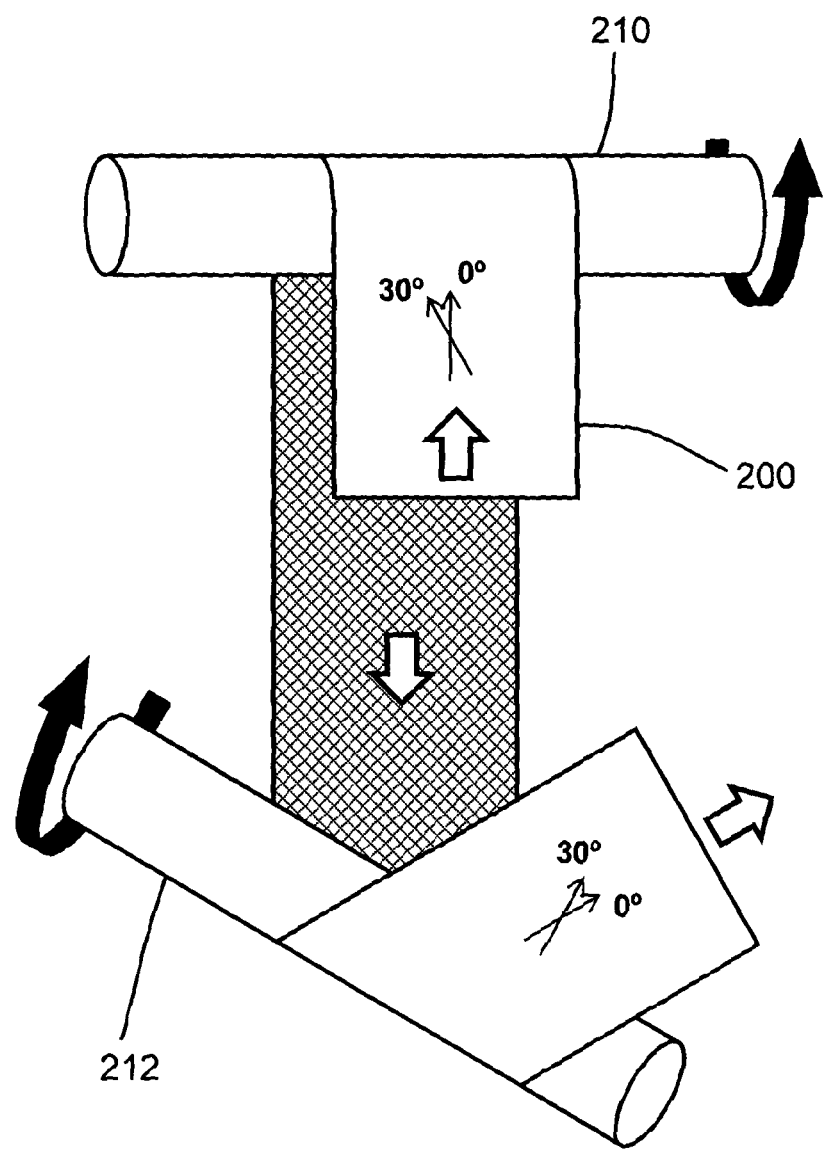
FIG. 36 schematically illustrates a compound curling process in which the precursor composite material is subjected to sequentially different shear directions.

As will be apparent to the skilled person, it is possible to construct arrangements of rollers that are angularly offset from each other in order to provide a continuous (or semi-continuous) process in which the precursor composite material is subjected to angularly varying shear directions. A simple example is shown in FIG. 36, in which precursor composite material 200 is first curled around first roller 210 to give a 0° shear direction and then curled around second roller 212 in order to give a 30° shear direction. It will be noted that the angular offset between the rotational axes of the rollers 210, 212 is also 30°.

FIG. 37 shows the effect of curling on ordering of the particles in the material, when the shear direction is maintained at 0°. The results show the reflection intensity from the composite optical material. The results show that unidirectional shear provides some improvement of ordering up to about 20 passes, after which the ordering starts to deteriorate.

FIG. 38 shows the effect of curling on ordering of the particles in the material, when the shear direction is altered between 0° and 30°. The results again show the reflection intensity from the composite optical material. The results show that bidirectional shear provides very significant improvement of ordering up to 40 passes, the ordering being very much better than in the unidirectional shear example.

In some embodiments, more than one subsequent direction of shear may be used, in order to provide further improvement of ordering of the particles.

The variation in shear direction is also found to provide surprisingly advantageous results when combined with the use of a viscosity-reducing agent as set out above.

Use of Block Copolymers in Place of Core-Shell Particles

The disclosure above relates primarily to composite optical materials in which a three dimensional ordered arrangement is provided by self-assembly of core-shell particles the so-called polymer opal materials. The present inventors have realised that aspects of the invention may be applied to other materials than polymer opal materials.

An example of a different type of material that exhibits structural colour are composite optical materials formed using block copolymers. Parnell et al [A. J. Parnell et al "Continuously tuneable optical filters from self-assembled block copolymer blends", Soft Matter, 2011, 7, 3721] disclose the blending of two symmetric high molecular weight diblock copolymers (poly(styrene-b-isoprene) (PS-b-PI)) of different molecular weights. The precursor material is shear aligned to form a one dimensional Bragg reflector. Similarly, Chan et al [E. P. Chan et al "Block copolymer photonic gel for mechanochromic sensing" Advanced Materials, Volume 23, Issue 40, pp. 4702-4706 (2011)] disclose a symmetric polystyrene-b-poly-2-vinylpyridine (PS-b-P2VP) diblock copolymer self-assembled into a one dimensional lamellar stack.

The use of shear-assisted self-assembly of the ordered lamellae is disclosed in Parnell et al. This can be improved using the curling or edge techniques disclosed above. In particular, curling or edging to a defined radius of curvature provides a much more repeatable shearing than manual oscillation. Therefore the ordering results in the diblock copolymer materials is correspondingly more repeatable.

In the preferred embodiments, the shear strain magnitude and the number of repetitions is as set out above for the polymer opal materials.

It is also preferred that the shear strain direction is altered, as for the polymer opal materials. However, one important difference is that the block copolymer materials do not have a close packing direction in the sense that polymer opals do. Therefore the angle between the different shear strain directions is of lesser importance in relation to block copolymer materials.

The embodiments set out above have been described by way of example. On reading this disclosure, modifications of these embodiments, further embodiments and modifications thereof will be apparent to the skilled person and as such are within the scope of the present invention.

The invention claimed is:

1. A process for manufacturing a composite optical material comprising a three dimensionally periodic arrangement of core particles in a matrix material, including the steps:
    (a) providing a sandwich structure of a precursor composite material held between first and second sandwiching layers, wherein the precursor composite material comprises a dispersion of core particles in matrix material;
    (b) for at least part of the sandwich structure, imposing a relative shear displacement between the first and second sandwiching layers, using a curved surface of a curved support device to apply a radius of curvature to the sandwich structure, thereby providing a shear strain of at least 10% in the precursor composite material, wherein shear strain is defined as $d/t_c$, where d is the modulus of the relative shear displacement between the first and second sandwiching layers and $t_c$ is the thickness of the precursor composite material before the shear displacement is applied to the first and second sandwiching layers;
    (c) after step (b), reducing the relative shear displacement between the first and second sandwiching layers in order to reduce the shear strain in the precursor composite material, wherein the process includes repeating step (b) after step (c) at least once, the repeating shear strain promoting ordering of the core particles to convert the precursor composite material to the composite optical material, and wherein the radius of curvature applied to the structure in step (b) is at least 10 μm.

2. A process according to claim 1 wherein the precursor composite material comprises a population of core-shell particles, each particle comprising a core and a shell material surrounding the core, the shell material having Tg lower than that of the core.

3. A process according to claim 1 wherein the core particles have a substantially monodisperse size distribution.

4. A process according to claim 3 wherein the core particles have a mean particle diameter in the region of about 50-500 nm.

5. A process according to claim 1 wherein the temperature of the precursor composite material during step (b) is at most 300° C.

6. A process according to claim 1 wherein the material of the sandwiching layers used in the process has a higher elastic modulus than the precursor composite material, by a factor of at least 2, at the processing temperature.

7. A process according to claim 1 wherein, in step (b), the shear strain provided to the precursor composite material is at least 50%.

8. A process according to claim 1 wherein, in step (b), the shear strain provided to the precursor composite material is at most 500%.

9. A process according to claim 1 wherein steps (b) and (c) are repeated more than once, each performance of steps (b) and (c) being considered to be a shear strain cycle.

10. A process according to claim 1 wherein the radius of curvature applied to the structure in step (b) is at least 1 mm.

11. A process according to claim 1 wherein the radius of curvature applied to the structure in step (b) is at most 10 mm.

12. A process according to claim 1 wherein the shear strain is applied to the precursor composite material in the sandwich structure using a roller.

13. A process according to claim 1 wherein the precursor composite material is formed into a layer between the first and second sandwiching layers by the steps:
providing a population of core-shell particles, each particle comprising a core and a shell material surrounding the core;
adding a viscosity-reducing agent to the population of core-shell particles to provide a reduced-viscosity composition; and
causing the reduced-viscosity composition to be formed into a layer between the first and second sandwiching layers.

14. A process according to claim 13 wherein the viscosity-reducing agent is removed from the composition after step (c) to increase the viscosity of the precursor composite material.

15. A process according to claim 14 wherein the viscosity-reducing agent is removed from the composition by evaporation.

16. A process according to claim 13 wherein the viscosity-reducing agent is modified in situ in the composition after step (c) to increase the viscosity of the precursor composite material.

17. A process according to claim 16 wherein the viscosity-reducing agent is modified by cross-linking and/or polymerisation.

18. A process according to claim 17 wherein a photoinitiator is included in the reduced-viscosity composition and the cross-linking and/or polymerisation is stimulated by UV radiation.

19. A process according to claim 16 wherein the viscosity-reducing agent is a monomer or prepolymer.

20. A process according to claim 13 wherein the material of the shell surrounding each core is grafted to the core via an interlayer, and wherein the viscosity-reducing agent is non-grafted polymer of similar composition to the material of the shell.

21. A process according to claim 20 wherein the viscosity-reducing agent has a molecular weight lower than that of the material of the shell.

22. A process according to claim 13 wherein the viscosity-reducing agent is added in an amount of 10 wt % or less based on the weight of core-shell particles.

23. A process according to claim 13 wherein the sandwich structure is formed at a temperature of 120° C. or less.

24. A process according to claim 13 wherein steps (b) and (c) are carried out at a temperature of 120° C. or less.

25. A process according to claim 13 wherein steps (b) and (c) are carried out at room temperature.

26. A process according to claim 1 wherein in at least one of the repetitions of step (b) after step (c), the direction of shear is changed.

27. A process according to claim 26 wherein an initial direction of shear corresponds to a close packing direction and a subsequent, different direction of shear corresponds to a direction which differs from the initial direction of shear by at least 5°.

28. A process according to claim 27 wherein the subsequent direction of shear differs from the initial direction of shear by about 30° or more but less than 180°.

29. A process according to claim 27 wherein the initial and subsequent directions of shear correspond to different close packed directions.

30. A process according to claim 27 wherein more than one subsequent direction of shear is used.

31. A process for manufacturing a composite optical material comprising a periodic arrangement of two or more components, the arrangement exhibiting structural colour, the process including the steps:
(a) providing a sandwich structure of a precursor material held between first and second sandwiching layers, wherein the precursor material comprises a mixture of said two or more components;
(b) for at least part of the sandwich structure, imposing a relative shear displacement between the first and second sandwiching layers, using a curved surface of a curved support device to apply a radius of curvature to the sandwich structure, thereby providing a shear strain of at least 10% in the precursor material, wherein shear strain is defined as $d/t_c$, where d is the modulus of the relative shear displacement between the first and second sandwiching layers and $t_c$ is the thickness of the precursor composite material before the shear displacement is applied to the first and second sandwiching layers;
(c) after step (b), reducing the relative shear displacement between the first and second sandwiching layers in order to reduce the shear strain in the precursor material, wherein the process includes repeating step (b) after step (c) at least once, the repeating shear strain promoting ordering of said two or more components to convert the precursor material to the composite optical material, and wherein the radius of curvature applied to the structure in step (b) is at least 10 μm.

32. A process according to claim 31 wherein the periodic arrangement is a one dimensional periodic arrangement, the two or more components being arranged into alternating lamellae in the composite optical material.

33. A process according to claim 31 wherein the precursor material comprises a block copolymer, said two or more components corresponding to respective different parts of the block copolymer.

34. A process according to claim 31 wherein the material of the sandwiching layers used in the process has a higher elastic modulus than the precursor material, by a factor of at least 2, at the processing temperature.

35. A process according to claim 31 wherein, in step (b), the shear strain provided to the precursor material is at least 50%.

36. A process according to claim 31 wherein, in step (b), the shear strain provided to the precursor material is at most 500%.

37. A process according to claim 31 wherein steps (b) and (c) are repeated more than once, each performance of steps (b) and (c) being considered to be a shear strain cycle.

38. A process according to claim 31 wherein the radius of curvature applied to the structure in step (b) is at least 1 mm.

39. A process according to claim 31 wherein the radius of curvature applied to the structure in step (b) is at most 10 mm.

40. A process according to claim 31 wherein the shear strain is applied to the precursor composite material in the sandwich structure using a roller.

41. A process according to claim 31 wherein in at least one of the repetitions of step (b) after step (c), the direction of shear is changed.

42. A process according to claim 41 wherein an initial direction of shear corresponds to a close packing direction and a subsequent, different direction of shear corresponds to a direction which differs from the initial direction of shear by at least 5°.

43. A process according to claim 41 wherein more than one subsequent direction of shear is used.

44. A process according to claim 1, wherein each performance of steps (b) and (c) is defined as a shear strain cycle, and wherein the process uses at least 5 shear strain cycles.

45. A process according to claim 31, wherein each performance of steps (b) and (c) is defined as a shear strain cycle, and wherein the process uses at least 5 shear strain cycles.

* * * * *